US005922218A

United States Patent [19]

Miyata et al.

[11] Patent Number: 5,922,218

[45] Date of Patent: Jul. 13, 1999

[54] METHOD OF PRODUCING INK JET RECORDING HEAD

[75] Inventors: Yoshinao Miyata; Tsutomu Nishiwaki, both of Nagano, Japan

[73] Assignee: Seiko Epson Corporation, Tokyo, Japan

[21] Appl. No.: 08/795,565

[22] Filed: Feb. 6, 1997

Related U.S. Application Data

[62] Division of application No. 08/634,770, Apr. 19, 1996.

[30] Foreign Application Priority Data

| | | | |
|---|---|---|---|
| Apr. 19, 1995 | [JP] | Japan | 7-94017 |
| Apr. 19, 1995 | [JP] | Japan | 7-94019 |
| Dec. 8, 1995 | [JP] | Japan | 7-320858 |
| Dec. 12, 1995 | [JP] | Japan | 7-322656 |
| Dec. 12, 1995 | [JP] | Japan | 7-322657 |

[51] Int. Cl.[6] .............. B44C 1/22; H01L 21/00

[52] U.S. Cl. .............. 216/27; 216/2; 216/41

[58] Field of Search .............. 216/2, 27, 41; 156/647.1

[56] References Cited

U.S. PATENT DOCUMENTS

| | | | |
|---|---|---|---|
| 5,637,126 | 6/1997 | Ema et al. | 216/27 X |

FOREIGN PATENT DOCUMENTS

| | | |
|---|---|---|
| 0408306A2 | 7/1990 | European Pat. Off. . |
| 55-11811 | 5/1987 | Japan . |
| 5-504740 | 7/1993 | Japan . |
| 6-55733 | 3/1994 | Japan . |
| 7-125198 | 5/1995 | Japan . |
| 07176770 | 7/1995 | Japan . |

*Primary Examiner*—William Powell

*Attorney, Agent, or Firm*—Sughrue, Mion, Zinn, Macpeak & Seas, PLLC

[57] ABSTRACT

In an ink jet head having: a nozzle plate in which a plurality of nozzle openings are formed; a flow path substrate comprising a reservoir to which ink is externally supplied, and a plurality of pressure chambers which are connected to the reservoir via an ink supply port and which respectively communicate with the nozzle openings; an elastic film which pressurizes ink in the pressure chambers; and driving means located at a position opposing the respective pressure chambers for causing the elastic film to conduct flexural deformation, the pressure chambers are arranged in a single-crystal silicon substrate of a (110) lattice plane and along a <112> lattice orientation.

7 Claims, 17 Drawing Sheets

FIG. 4a(1)
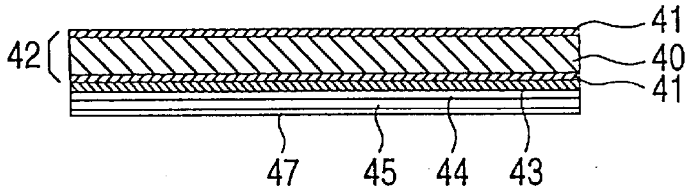
FIG. 4a(2)
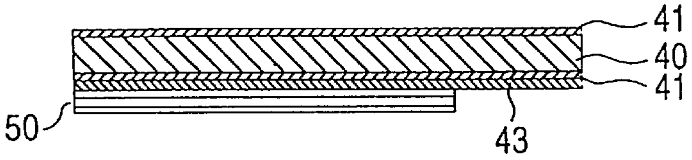
FIG. 4a(3)
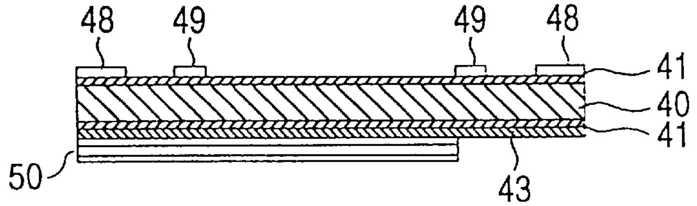
FIG. 4a(4)
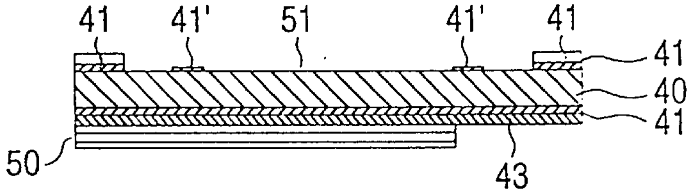
FIG. 4a(5)
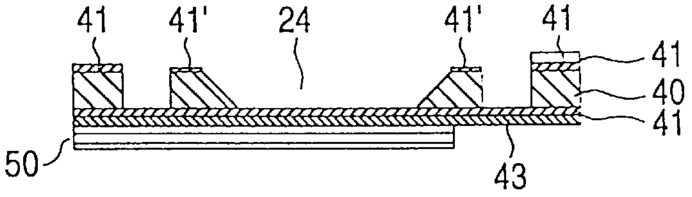
FIG. 4a(6)
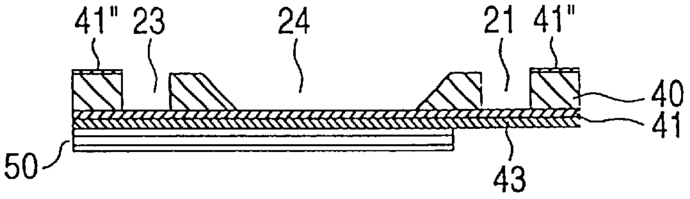
FIG. 4a(7)
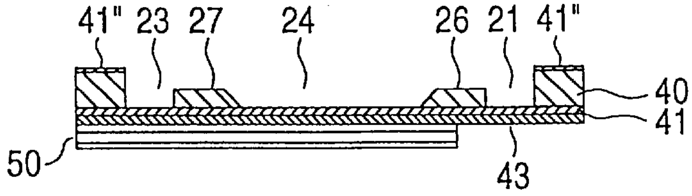
FIG. 4a(8)
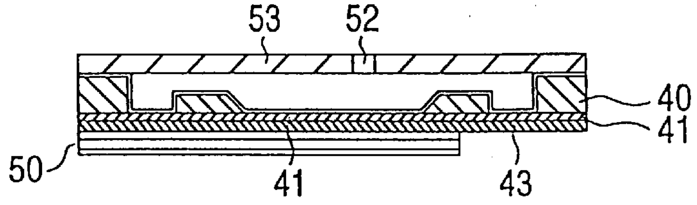

FIG. 4b(1)
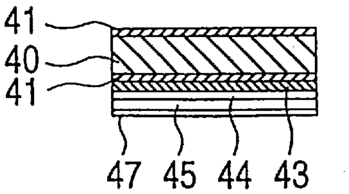
FIG. 4b(2)
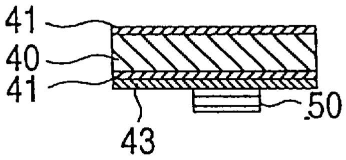
FIG. 4b(3)
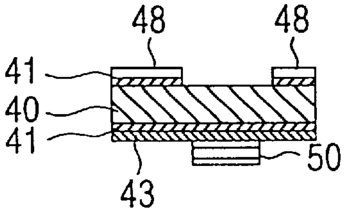
FIG. 4b(4)
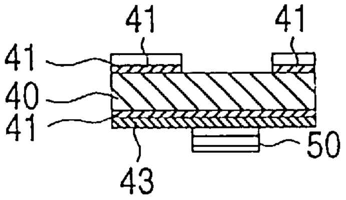
FIG. 4b(5)
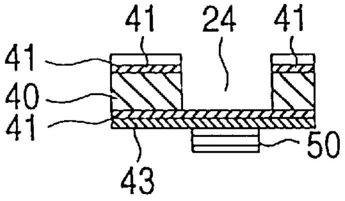
FIG. 4b(6)
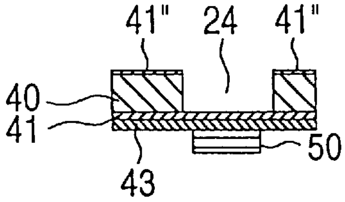
FIG. 4b(7)
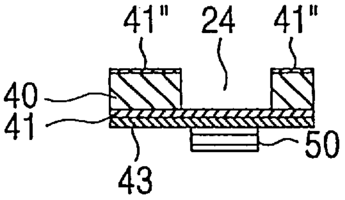
FIG. 4b(8)
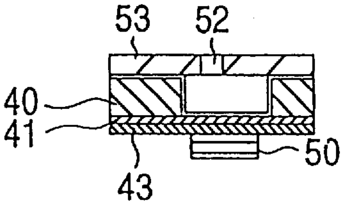

METHOD OF PRODUCING INK JET RECORDING HEAD

This is a Divisional of application Ser. No. 08/634,770 filed Apr. 19, 1996.

BACKGROUND OF THE INVENTION

1. Field of the Invention

The invention relates to an ink jet recording head in which a part of a pressure chamber communicating with a nozzle opening is expanded and contracted by an actuator conducting flexural vibration, thereby ejecting ink drops through the nozzle opening.

2. Description of Related art

There are two types of ink jet recording heads, i.e., the piezoelectric vibration type in which ink is pressurized by mechanically deforming a pressure chamber, and the bubble jet type in which a heating element is disposed in a pressure chamber and ink is pressurized by an air bubble produced by heat of the heating element. Ink jet recording heads of the piezoelectric vibration type are classified into two categories, a first recording head using a piezoelectric vibrator which is axially deformed, and a second recording head using a piezoelectric vibrator which conducts flexural displacement. The first recording head can be driven at a high speed and performs recording at a high density, but requires a cutting operation for producing the piezoelectric vibrator, and a three-dimensional assembly operation for fixing the piezoelectric vibrator to the pressure chamber, thereby producing a problem in that an increased number of production steps are necessary. By contrast, in the second recording head, the piezoelectric vibrator has a membrane-like shape, and hence can be formed by baking the piezoelectric vibrator integrally with an elastic film constituting the pressure chamber. Consequently, the second recording head has a reduced number of production steps. However, the second recording head requires an area of a size sufficient to conduct flexural vibration so that the pressure chamber has a large width, thereby reducing the arrangement density.

In order to solve the problem of a recording head using flexural vibration, for example, Japanese Patent Publication (Kokai) No. HEI5-504740 discloses an ink jet recording head comprising: a substrate in which pressure chambers are formed in a single-crystal silicon substrate of a (110) lattice plane; and a nozzle plate in which a plurality of nozzle openings communicating with the pressure chambers are formed and which is fixed to one face of the substrate. The other face of the substrate is formed as a membrane which is elastically deformable. A driving portion is integrally disposed by forming a piezoelectric film on the surface of the membrane by a film formation method. The driving portion conducts flexural vibration so as to pressurize ink in the pressure chambers, thereby ejecting ink drops from the nozzle openings.

In the disclosed head, the pressure chambers, ink supply ports attached to the chambers, and, a reservoir are formed by conducting anisotropic etching on a single-crystal silicon wafer. Because of the characteristics of anisotropic etching, the pressure chambers are obliged to be arranged along a <111> lattice orientation of the single-crystal silicon wafer. This causes the wall face of the reservoir for supplying ink to the pressure chambers, to be formed on a (110) plane which is perpendicular to the <111> lattice orientation. However, it is very difficult to form the (110) plane by conducting anisotropic etching on a single-crystal silicon substrate. Therefore, a technique in which a wall face defining a reservoir is etched so as to be approximated by a continuum of minute (111) planes is employed.

In order to form minute (111) etched planes, patterns which are called compensating patterns and disclosed in, for example, Japanese Patent Publication (Kokai) No. HEI7-125198, must be formed so as to prevent the etching from being excessively conducted. The compensating patterns are gradually shortened as the etching of a single-crystal silicon wafer proceeds, and then formed into a sword-like shape which is necessary for minute (111) planes to remain at the completion of the etching. Consequently, the ink reservoir must have a width which is greater than at least the length of the compensating patterns, so that extra regions for the compensating patterns are required. This produces problems in that the size of the ink jet head is increased, and that an expensive wafer is wastefully consumed.

When an image such as a graphic image is to be printed, since dots must be formed at a high density, nozzle openings also are required to be arranged at a high density. As a result, very small ink drops, in the order of 10–30 ng per drop, are required to be ejected. In order to comply with these requirements, improvements such as reduced width pressure chambers, and partition walls of the pressure chambers having a reduced thickness must be produced in the substrate in which flow paths are to be formed. When the width of the fluid pressure chambers is reduced or when the partition walls are made thin, however, there arise further problems in that the ink flow in the pressure chambers is impeded, that air bubbles remain in the flow paths, and that the partition walls are easily deflected and crosstalk occurs, thereby impairing the printing quality.

Even when such requirements are fulfilled, a further requirement is produced as described below. A nozzle plate which closes one face of each pressure chamber is elastically contacted with and sealed by a capping member for preventing the flow paths from clogging, and rubbed with a cleaning member which is made of an elastic material such as rubber. Consequently, the nozzle plate must have a mechanical strength which can endure such operations. In order to ensure the strength, a metal plate member constituting the nozzle plate must have a thickness of 80 $\mu$m or more. On the other hand, nozzle openings which can eject ink drops satisfying the above-mentioned requirements have a diameter of about 30 $\mu$m on the ink ejection side. In the view point of problems which may be produced in processing, the diameter of nozzle openings on the pressure chamber side must be at least 70 $\mu$m, preferably about 90 $\mu$m. When pressure chambers are designed so as to have a reduced width so as to attain a higher arrangement density, therefore, nozzle openings are partly closed by partition walls of the pressure chambers, thereby producing a problem in that ink flow from the pressure chambers toward the nozzle openings is impeded.

Furthermore, a signal must be supplied to the driving portion without impeding the vibrating operation. Therefore, it is impossible to directly connect a cable to the driving portion. To comply with this, a structure must be employed in which a lead pattern elongating to the driving portion is formed on the surface of a vibrating plate and a cable is connected to the lead pattern at a position which is separated from the vibrating region. When the driving portion is formed by the above-mentioned film formation method, the level difference between the driving portion and the lead pattern must be made as small as possible so as to ensure the connection therebetween. Therefore, a countermeasure is taken in the following manner. The piezoelectric film constituting the driving portion is extended to the region where the lead pattern is to be formed, so as to serve as an insulating film for insulating a lower electrode. Thereafter, a lead pattern is formed on the surface of the piezoelectric film by vapor deposition or the like. However, this countermeasure has the following disadvantage. An electrostatic capacity of a value which is negligible in the view point of transmission of a signal is produced between upper and lower electrodes in the wiring region. This occurs because the piezoelectric film has originally a high specific dielectric constant and is very thin. The extra electrostatic capacity produces problems such as the apparent power is increased and the driving circuit is required to have a large current capacity, and that, when a voltage is applied to the lead pattern, piezoelectric displacement or heat generation is caused although the region is a wiring region, whereby the lead pattern formed on the surface is broken or the film is stripped.

SUMMARY OF THE INVENTION

The invention is directed to an ink jet head comprising: a nozzle plate in which a plurality of nozzle openings are formed; a flow path substrate comprising a reservoir to which ink is externally supplied, and a plurality of pressure chambers which are connected to the reservoir via an ink supply port and which respectively communicate with the nozzle openings; an elastic film which pressurizes ink in the pressure chambers; and driving means located at a position opposing the respective pressure chamber for causing the elastic film to conduct flexural deformation, wherein the pressure chambers are arranged in a single-crystal silicon substrate of a (110) lattice plane and along a <112> lattice orientation.

Therefore, it is a first object of the invention to provide an ink jet recording head using a single-crystal silicon substrate which allows the size of the ink reservoir to be reduced to a value that enables the printing function.

Furthermore, the invention is directed to an ink jet head comprising: a nozzle plate in which a plurality of nozzle openings are formed; a flow path substrate comprising a reservoir to which ink is externally supplied, and a plurality of pressure chambers which are connected to the reservoir via an ink supply port and which respectively communicate with the nozzle openings; an elastic film which pressurizes ink in the pressure chambers; and driving means located at a position opposing the respective pressure chamber for causing the elastic film to conduct flexural deformation, wherein the pressure chambers are arranged in a single-crystal silicon substrate of a (110) lattice plane and along a <112> lattice orientation, and a nozzle connecting portion is formed in a region opposing the nozzle openings, the nozzle connecting portion being wider than the other region.

Therefore, it is a second object of the invention to provide an ink jet recording head in which the pressure chambers can be arranged at a high density while preventing crosstalk from occurring, and the pressure chambers and the nozzle openings are smoothly joined to each other so that ink drops are stably ejected.

Furthermore, the invention is directed to an ink jet head comprising: a nozzle plate in which a plurality of nozzle openings are formed; a flow path substrate comprising a reservoir to which ink is externally supplied, and a plurality of pressure chambers which are connected to the reservoir via an ink supply port and which respectively communicate with the nozzle openings; an elastic film which pressurizes ink in the pressure chambers; and driving means located at a position opposing the respective pressure chamber for causing the elastic film to conduct flexural deformation, wherein the ink jet head further comprises on a surface of the elastic film: a lower electrode; a piezoelectric film formed in a region opposing the respective pressure chamber; a second film having a composition different than that of the piezoelectric film formed in a wiring region for supplying a driving signal to the piezoelectric film, the second film having a dielectric constant and piezoelectric properties which are lower than those of the piezoelectric film; an upper electrode formed on a surface of the piezoelectric film; and a lead pattern which is formed on a surface of the second film and connected to the upper electrode.

Therefore, it is a third object of the invention to provide an ink jet recording head in which the capacitance of a wiring region can be made as small as possible so that the load of a driving circuit is reduced, and the possibility of breakage in the wiring region can be made as low as possible.

It is a fourth object of the invention to provide a method of producing such a recording head.

BRIEF DESCRIPTION OF THE DRAWINGS

FIGS. 4(*a*)(1)–4(*a*)(8) and 4(*b*)(1)–4(*b*)(8) are views showing sections along a longitudinal direction and a width direction of a pressure chamber and showing steps of forming the flow path substrate from a single-crystal silicon substrate, respectively.

PREFERRED EMBODIMENTS OF THE INVENTION

Figure 1:
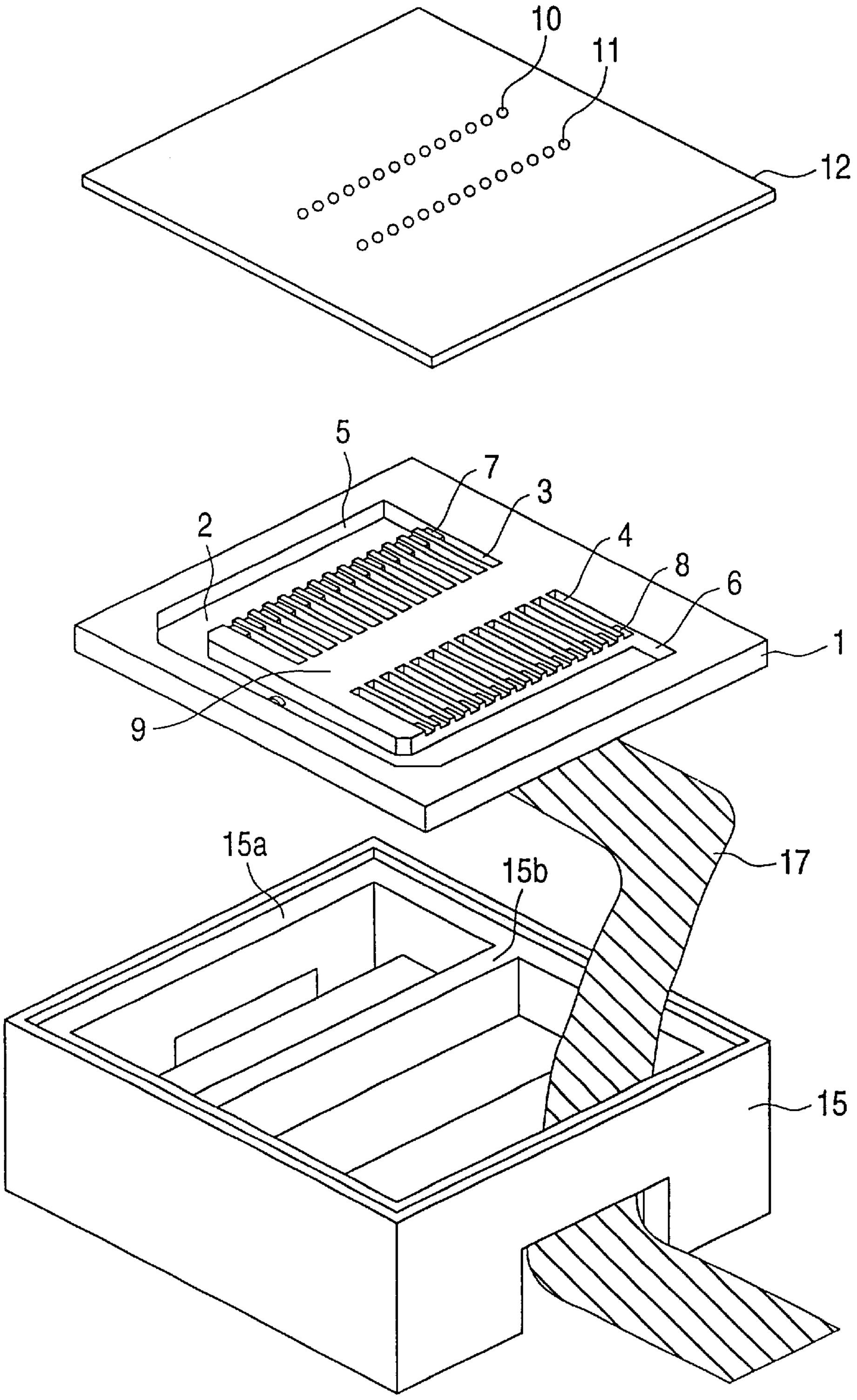
FIGS. 1 and 2 are an exploded perspective view and a section view showing an embodiment of the ink jet recording head of the invention, respectively.
Figure 2:
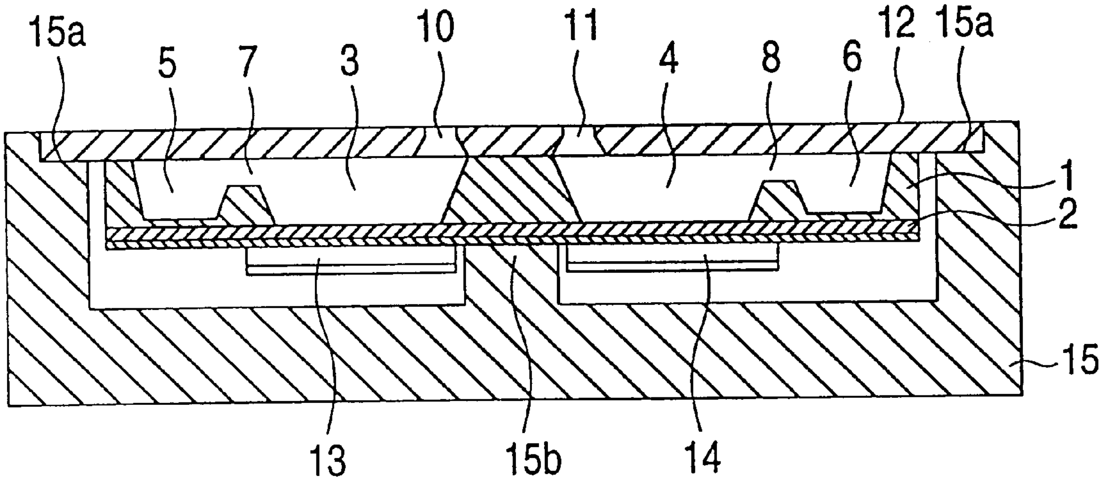

FIGS. 1 and 2 show an embodiment of the invention. The reference numeral 1 designates an ink pressure chamber substrate which is formed by etching a single-crystal silicon substrate. The top surface of the substrate is used as an opening face 9. A plurality of rows or, in the embodiment, two rows of pressure chambers 3, 3, . . . , and 4, 4, . . . which are arranged in a staggered manner, reservoirs 5 and 6 which supply ink to the pressure chambers, and ink supply ports 7 and 8 through which the pressure chambers 3 and 4 communicate with the reservoirs 5 and 6 are formed in such a manner that a membrane portion 2 is formed on the back face, a nozzle plate 12 is fixed to the opening face 9. In the nozzle plate, nozzle openings 10 and 11 are formed so as to communicate with one end of a respective one of the pressure chambers 3 and 4. Piezoelectric films 13 and 14 (see FIG. 2) formed by a film formation method are disposed on the back face. The ink pressure chamber substrate 1 and the nozzle plate 12 are integrally fixed to each other so as to attain the liquid-tightness, and are housed in a holder 15 having supporting parts 15*a* and 15*b* which support the peripheral and center portions, thereby configuring a recording head. In FIG. 1, 17 designates a flexible cable through which a driving signal is supplied to the piezoelectric films 13 and 14.

Figure 3A:
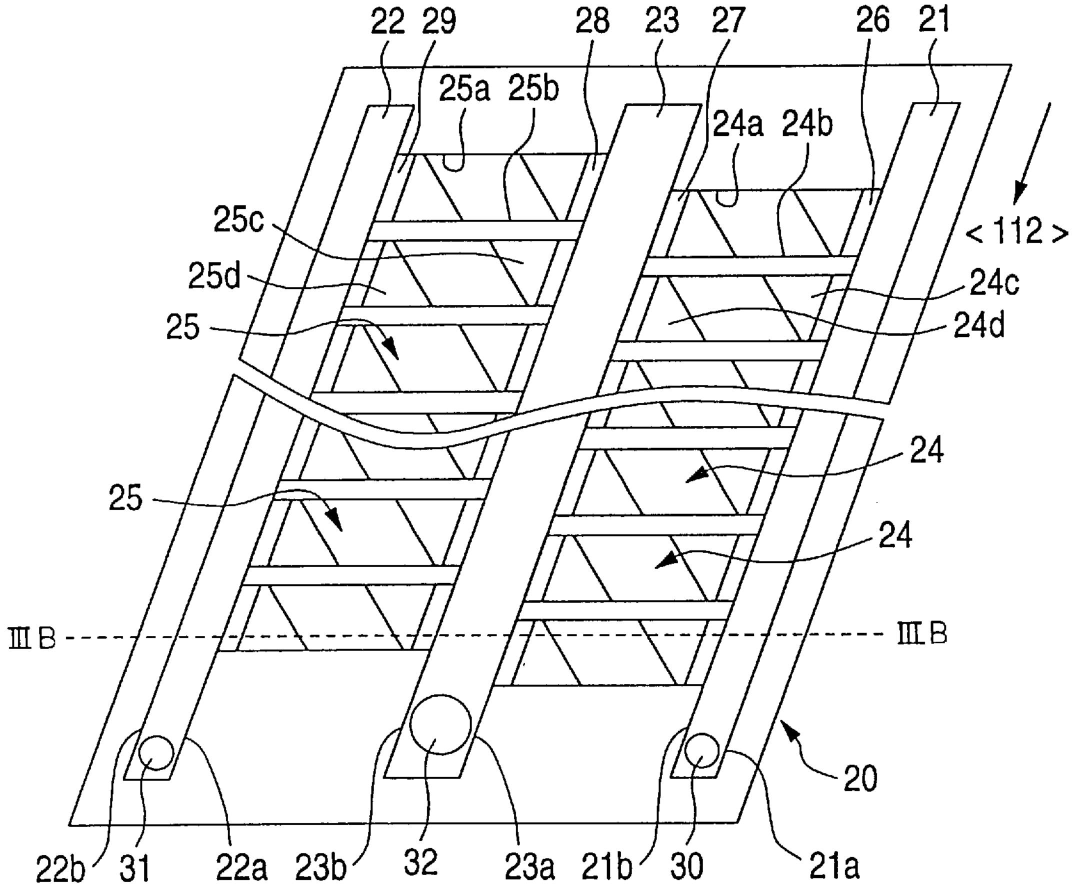
FIGS. 3*a* and 3*b* are a view showing the structure of a flow path substrate as seen from the top, and a view showing a section taken along a line IIIB—IIIB of an embodiment of a recording head configured by using the substrate, respectively.
Figure 3B:
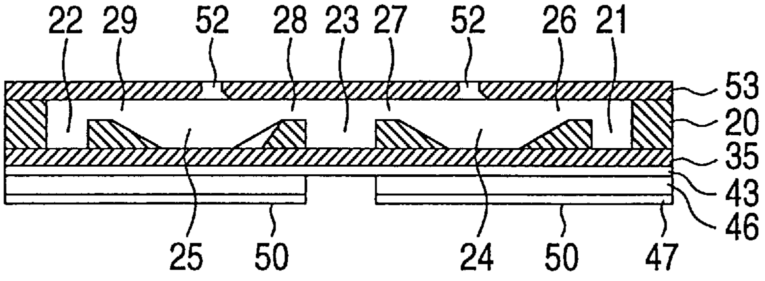

FIG. 3*a* is a plan view showing an embodiment of the flow path substrate, and FIG. 3*b* is a view showing a sectional structure. In the figures, 20 designates a wafer of a single-crystal silicon substrate which is cut so that the surface is a (110) lattice plane. In the wafer, ink reservoirs 21, 22, and 23 are formed in the side and center portions, and pressure chambers 24 and 25 are formed between the ink reservoirs or in two rows. In each of the rows of the pressure chambers 24 and 25, ink supply ports 26 and 27 or 28 and 29 for receiving ink from the reservoirs 21 and 23 or 22 and 23 which are positioned at both the sides of the row are formed. Ink introducing ports 30, 31, and 32 for receiving ink from an external ink tank are opened at ends of the ink reservoirs 21, 22, and 23.

Next, a method of producing the flow path substrate will be described with reference to FIGS. 4*a* and 4*b*. A base material 42 is prepared wherein an $SiO_2$ layer 41 of a thickness of about 1 μm is formed by the thermal oxidation method or the like on the entire surface of a single-crystal silicon substrate 40 which is cut so that the surface is (110). The $SiO_2$ layer 41 serves as an insulating film for a driving portion which will be formed thereon, and also as an etching protective film for a process of etching the single-crystal silicon substrate 40. A film of zirconia (Zr) is formed on the surface of the $SiO_2$ layer 41 by sputtering, and the film is subjected to thermal oxidation, thereby forming an elastic film 43 which has a thickness of 0.8 μm and is made of zirconium oxide. The elastic film 43 made of zirconium oxide has a large Young's modulus so that distortion of a piezoelectric film 44 which will be described later is converted into flexural displacement at high efficiency. A film of platinum (Pt) of a thickness of about 0.2 μm is formed by sputtering on the surface of the elastic film 43, thereby forming a lower electrode 45. A film 46 (see FIG. 3*b*) of a thickness of 1.0 μm is formed by sputtering or the like of a piezoelectric material such as PZT on the surface of the lower electrode 45. Thereafter, an upper electrode 47 of aluminum (Al) of a thickness of 0.2 μm is formed on the surface of the film 46 by sputtering or the like (Step I, see FIGS. 4(*a*)1 and 4(*b*)(1).

The upper electrode 47, the piezoelectric film 46, and the lower electrode 45 are patterned so as to correspond to the arrangement positions of the pressure chambers 24 and 25, thereby forming a driving portion 50. This patterning is determined so that the arrangement of the pressure chambers 24 and 25 is directed along a lattice orientation of a <-1-1-2> zone axis in which zone planes are a (1-1-1) plane and a (110) plane, or a <112> lattice orientation which is equivalent to the orientation (in the description of embodiments, a crystal lattice is denoted by enclosing indices by curly brackets, for example, (110), a lattice orientation is denoted by enclosing indices by angle brackets, for example, <110>, and 1-bar of a unit cell is indicated as −1).

As a result of the patterning, the upper electrode 47 is patterned so as to serve also as lead conductors which are independently taken out in correspondence with the pressure chambers 24 and 25 and used as portions to be connected with a driving circuit. In the patterning, it is not essential to form the piezoelectric film 46 as divided films respectively independently corresponding to the pressure chambers 24 and 25. When the piezoelectric film 46 is divided into portions which are independently provided for the respective pressure chambers, however, a large amount of flexural displacement occurs, as described later. Therefore, the division of the piezoelectric film is preferable. Since the lower electrode 45 functions as a common electrode, it is preferable not to divide the lower electrode in the patterning. The patterning may be conducted each time when one layer is formed (Step II, see FIGS. 4(*a*)(2) and 4(*b*)(2)).

Photoresist layers 48 and 49 are formed so that the arrangement of the pressure chambers 24 and 25 is directed along a lattice orientation of a <-1-1-2> zone axis in which zone planes are a (1-1-1) plane and a (110) plane, or a <112> lattice orientation which has an equivalent orientation (Step III, see FIGS. 4(*a*)(3) and 4(*b*)(3)). The $SiO_2$ layer 41 is removed by using a hydrofluoric acid buffer solution in which hydrofluoric acid and ammonium fluoride are mixed in proportions of 1 : 6, so as to pattern a window 51 for anisotropic etching. Thereafter, the photoresist layer 49 for the regions of the $SiO_2$ layer where the ink supply ports 26, 27, 28, and 29 are to be formed is subjected to so-called multiple exposure in which the photoresist layer is again exposed to light. Half-etching is then conducted for about 5 min. by using the hydrofluoric acid buffer solution so that the thickness of the $SiO_2$ layer below the photoresist layer 49 is reduced to about 0.5 μm (Step IV, see FIGS. 4(*a*)(4) and 4(*b*)(4)).

After the resist layers 48 and 49 are removed [away], the base material 42 is immersed into a 10% by weight solution of potassium hydroxide heated to about 80° C., thereby executing anisotropic etching. As a result of the anisotropic etching, side walls 24*a* and 25*a* (see FIG. 3*a*) constituting the pressure chambers 24 and 25 appear as a (1-11) plane which is perpendicular to the (110) lattice plane of the surface of the single-crystal silicon substrate 40, and the other side walls 24*b* and 25*b* (see FIG. 3*a*) appear as a (-11-1) plane which is equivalent to a (1-11) plane. Longitudinal side walls 21*a*, 22*a*, and 23*a* defining the reservoirs 21, 22, and 23 appear as a (1-1-1) plane which is perpendicular to a (110) plane, and the other side walls 21*b,* 22*b,* and 23*b* appear as a (-111) plane which is equivalent to a (1-1-1) plane. By contrast, bottom portions 24*c* and 25*c* (see FIG. 3*a*) at a diagonal position of the pressure chambers 24 and 25 appear as a (111) plane inclined at about 35 deg. to a (110) plane, and the other bottom portions 24*d* and 25*d* (see FIG. 3*a*) appear as a (11-1) plane inclined at about 35 deg. to a (110) plane (hereinafter, planes of (1-11), (-11-1), (1-1-1), and (-111) which are perpendicular to a (110) plane are denoted merely by a perpendicular (111) plane, and a (111) plane and a (11-1) plane which are inclined at about 35 deg. to a (110) plane are denoted merely by a (111) plane of 35 deg.). At the same time, the $SiO_2$ layers 41 and 41' which have functioned as protective films are gradually dissolved so that a portion of about 0.4 μm is etched away, with the result that the $SiO_2$ layer 41' in the regions where the ink supply ports 26, 27, and 28 are to be formed has a thickness of about 0.1 μm and the $SiO_2$ layer 41 in the other region has a thickness of about 0.6 μm (Step V, see FIGS. 4(*a*)(5) and 4(*b*)(5)).

The base material 42 is immersed into the hydrofluoric acid buffer solution during a period sufficient for removing the $SiO_2$ layer of 0.1 μm, for example, about 1 min. so that the $SiO_2$ layer 41' in the regions where the ink supply ports 26, 27, and 28 are to be formed is removed away and the $SiO_2$ layer 41 in the other region remains as a layer 41" of a thickness of about 0.5 μm (Step VI, see FIGS. 4(*a*)(6) and 4(*b*)(6)). The base material 42 is immersed into an about 40% by weight solution of potassium hydroxide so as to be subjected to anisotropic etching, whereby the regions of the ink supply ports 26, 27, and 28 are again selectively etched. This makes the regions thinner so that flow paths having a fluid resistance necessary for an ink supply port are formed (Step VII, see FIGS. 4(*a*)(7) and 4(*b*)(7)). When a plurality of recording heads are formed in the single base material 42, the base material is divided into individual chips. Finally, a nozzle plate 53 in which nozzles 52 are opened and which is made of stainless steel is fixed to the chip by an adhesive agent, thereby competing the recording head (Step VIII, see FIGS. 4(*a*)(8) and 4(*b*)(8)).

In the above, the embodiment in which a single-crystal silicon wafer wherein the surface is the (110) plane has been described. It is obvious that, even when a single-crystal silicon wafer of (-110), (1-10), or (-1-10) is used, a recording head may be obtained in the same manner as described above.

As seen from the above description, the pressure chambers are arranged in a row along a <112> direction. Therefore, the longitudinal side wall of the reservoir can be formed as a perpendicular (111) plane and the width of the reservoir can be reduced. Accordingly, it is possible to configure an ink jet head in which the arrangement density of nozzle openings is high and the size is reduced. This can reduce the amount of an expensive single-crystal silicon substrate required for the manufacture of the recording head. Furthermore, the ink reservoir can be configured by a perpendicular (111) plane. Unlike a conventional etching system in which compensating patterns must be formed,.the wall surface of the flow path can be smoothly formed so as to allow ink and an air bubble to flow without a hitch.

Figure 5:
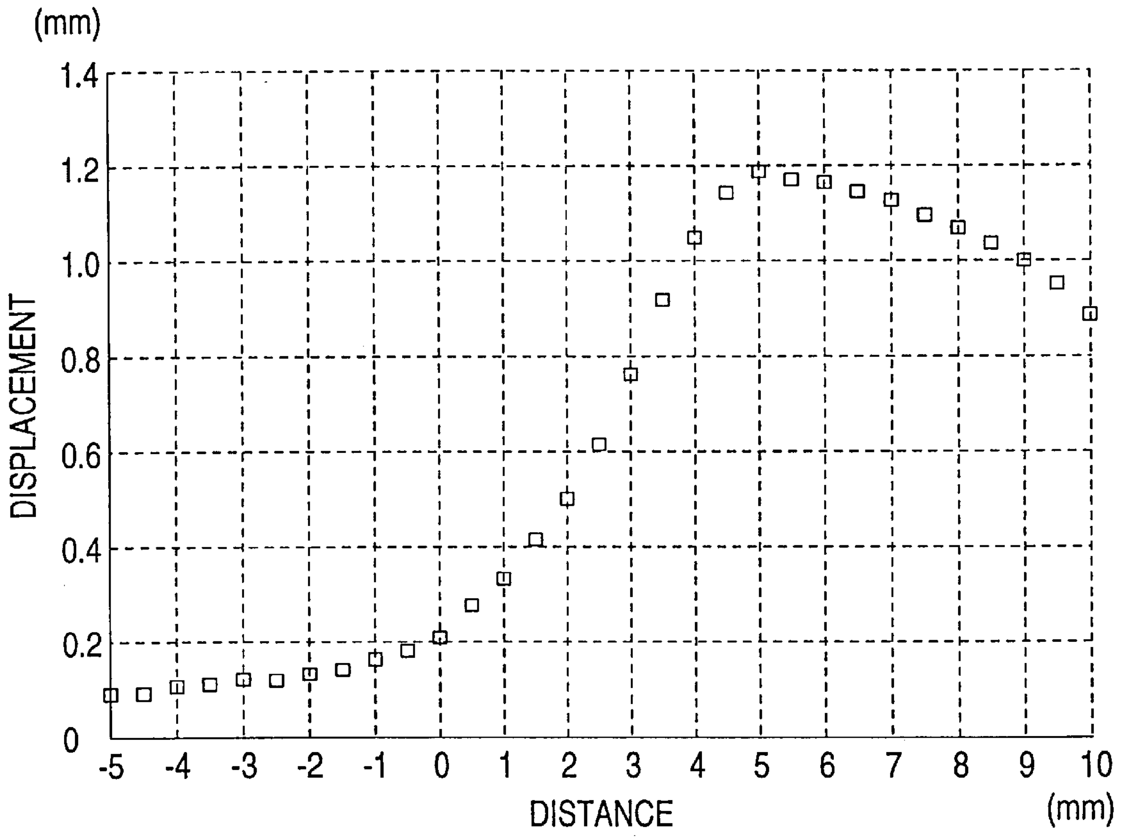
FIG. 5 is a graph showing relationships between a relative distance ΔX between a side wall of a driving portion and that of the pressure chamber, and a displacement Y of an elastic film obtained when the driving portion is driven by the same voltage.

When the piezoelectric film is to be patterned in Step II by etching, or formed in correspondence with the respective pressure chambers, it is preferable to adjust the sizes so that the distance between the side wall of each piezoelectric film and the center of the pressure chamber is shorter than that between the side wall defining the pressure chamber and the center of the pressure chamber. FIG. 5 is a graph showing the relationship between a relative distance ΔX (in FIG. 5, the minus sign indicates a projection) between the side walls of the driving portion 50 and the two side walls 25*a* and 25*b* defining the pressure chamber 25, and a displacement Y of the elastic film obtained when the same voltage is applied to the piezoelectric film.

In the case where the side walls of the driving portion 50 are projected outside the pressure chamber 25, the displacement of the driving portion 50 is very small and do not largely vary depending on the degree of the projection. This is caused by a phenomenon wherein the piezoelectric film of the driving portion 50 which is outwardly projected from the pressure chamber 25 constrains the side walls 25*a* and 25*b* of the pressure chamber 25 of the elastic film. By contrast, in the case where the side walls of the driving portion 50 are positioned inside the pressure chamber 24, the displacement is abruptly increased so that, in the embodiment, it is maximum at a position located on the inner side of the side walls of the pressure chamber 25 by about 5 μm and gradually reduced in a direction towards the center of the pressure chamber. This is caused by a phenomenon wherein the elastic film is free from the rigidity of the driving portion 50 so as to be easily deformed. When the side walls of the driving portion 50 are positioned further inward, the displacement becomes small because the area of the driving portion 50 is reduced. From the above, it will be seen that the width of the driving portion 50 is preferably formed so as to be slightly smaller than that of the pressure chamber 24. However, it is not necessary for the width to be smaller in the whole of the length of the pressure chamber. If the driving portion is narrower than only a portion of the pressure chamber, the elastic film is free from the rigidity of the driving portion 50 and hence the degree of displacement can be increased in accordance with the relative distance.

Figure 7:
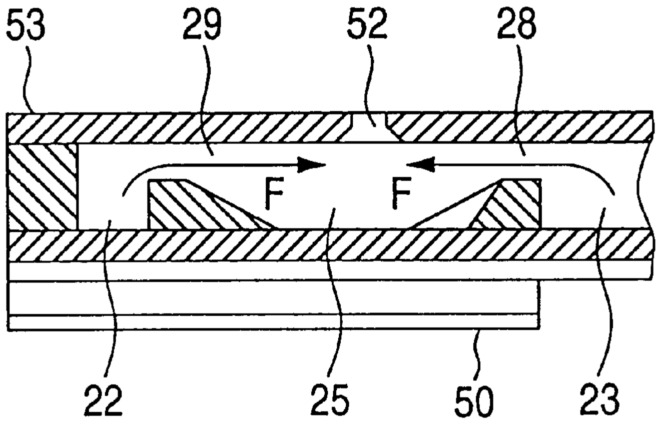
FIG. 7 is a diagram illustrating the ink flow in the pressure chamber of the recording head of the embodiment.

In the embodiment, each of the pressure chambers 25 is provided with the ink supply ports 28 and 29 formed at both the ends in the axial direction. As shown in FIG. 7, therefore, ink flows along paths which are respectively directed as indicated by arrows F from both the ends of the pressure chamber 25 to the center portion where the nozzle opening 52 is formed. Consequently, stagnation of ink at a corner of a pressure chamber which may often occur in a recording head wherein ink is supplied to a pressure chamber through a single ink supply port can be prevented from occurring, and an air bubble in a pressure chamber can be easily discharged to the outside together with an ink drop by the ink flow.

Figure 6:
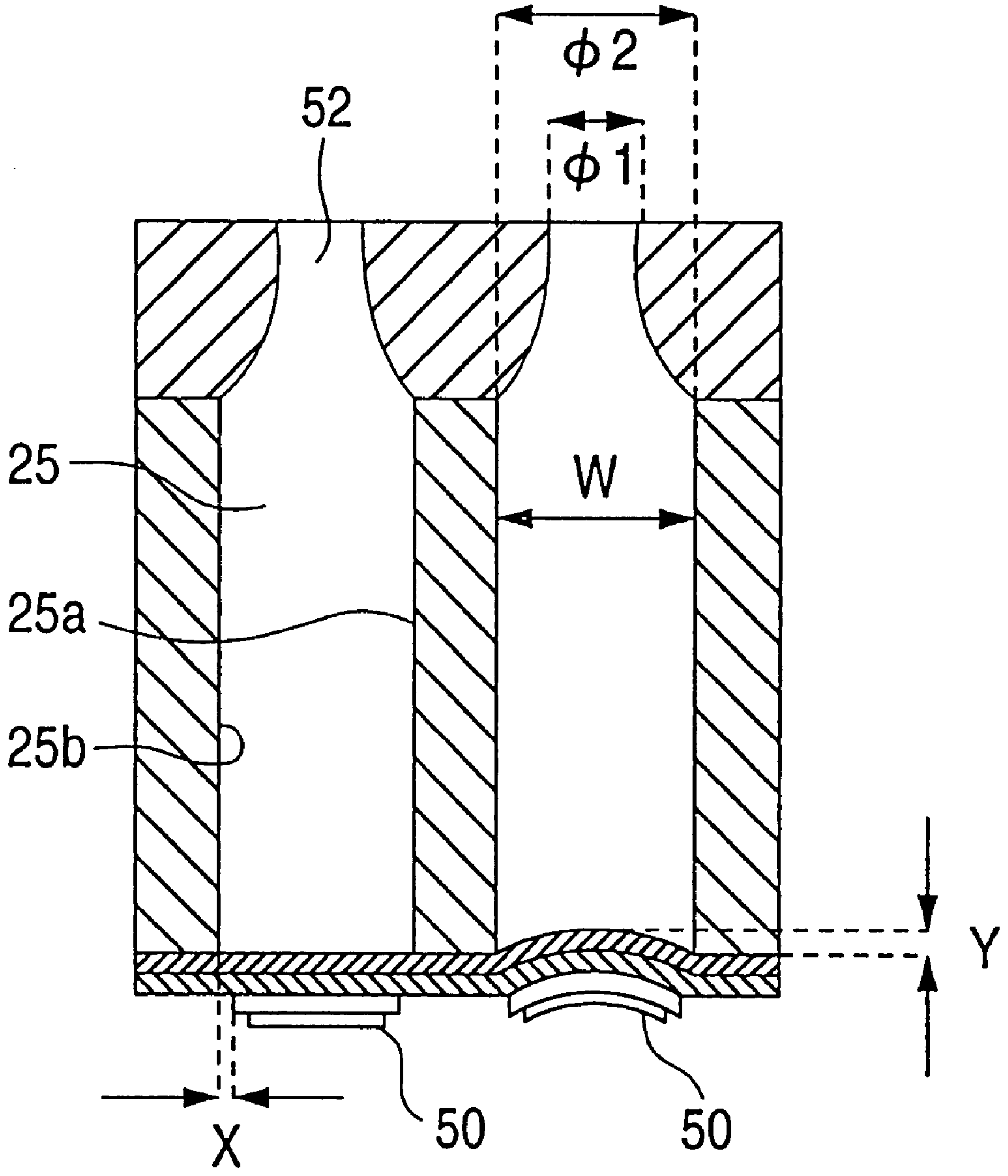
FIG. 6 is a diagram illustrating relative positional relationships between the driving portion and the pressure chamber, and the dimensions of the pressure chamber.

As described above, in an ink jet head, a metal plate of a thickness of about 90 μm is usually used as the nozzle plate 53 in the view point of mechanical strength. Each nozzle opening 52 formed in the nozzle plate has a smooth conical section shape in which the diameter Φ1 (FIG. 6) on the side of the ink ejection face is about 35 μm and the diameter Φ2 on the side of the pressure chamber is about 80 μm. The nozzle opening is required to allow ink to smoothly flow and stably eject an ink drop of an amount which is highly accurate.

When the driving portion is configured as a film as described above, a high electric field can be produced by a low voltage. When the film is made thinner, however, stress of a low degree is produced. In order to obtain certain displacement, therefore, the flexural rigidity of the elastic film must be lowered. When ink in the pressure chamber is to be ejected in the form of an ink drop from the nozzle opening, however, the elastic film 41 must have a rigidity which can endure the pressure of the ink. Consequently, the rigidity of the elastic film cannot be reduced unnecessarily.

In order to solve the tradeoff problems, the inventor determined that, when the width W of a pressure chamber is set to be 40 to 50 μm, the degree of displacement is not reduced and ink is surely pressurized, thereby enabling an ink drop to be satisfactorily ejected from the nozzle opening 52. As described above, however, the diameter Φ2 of the nozzle opening on the side of the pressure chamber is about 80 μm. Therefore, partition walls defining the pressure chambers having the width W of 40 to 60 μm partly close the nozzle opening, thereby producing a problem in that the ink flow directed toward the nozzle opening is impeded.

Figure 9:
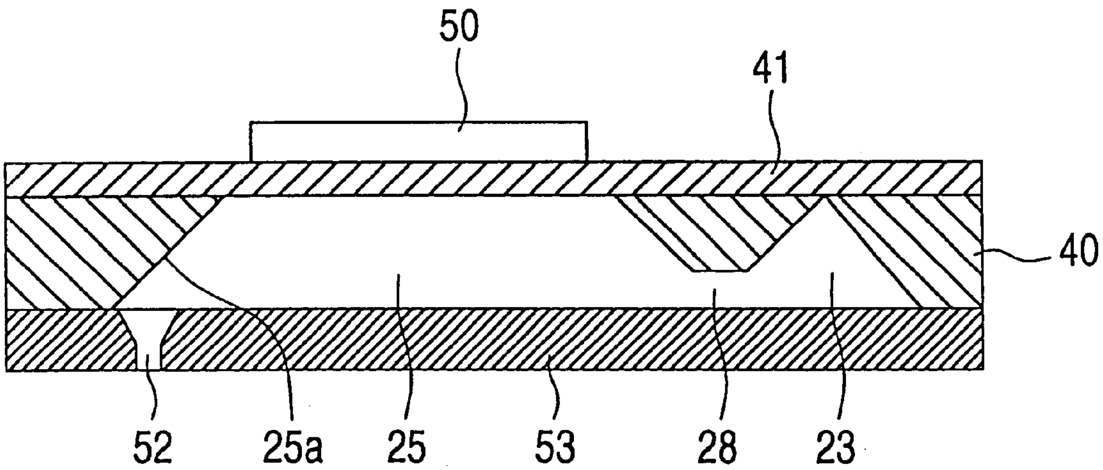
FIG. 9 is a view showing a section taken in a longitudinal direction of the pressure chamber and showing an embodiment of a method of producing the flow path substrate.
Figure 8A:
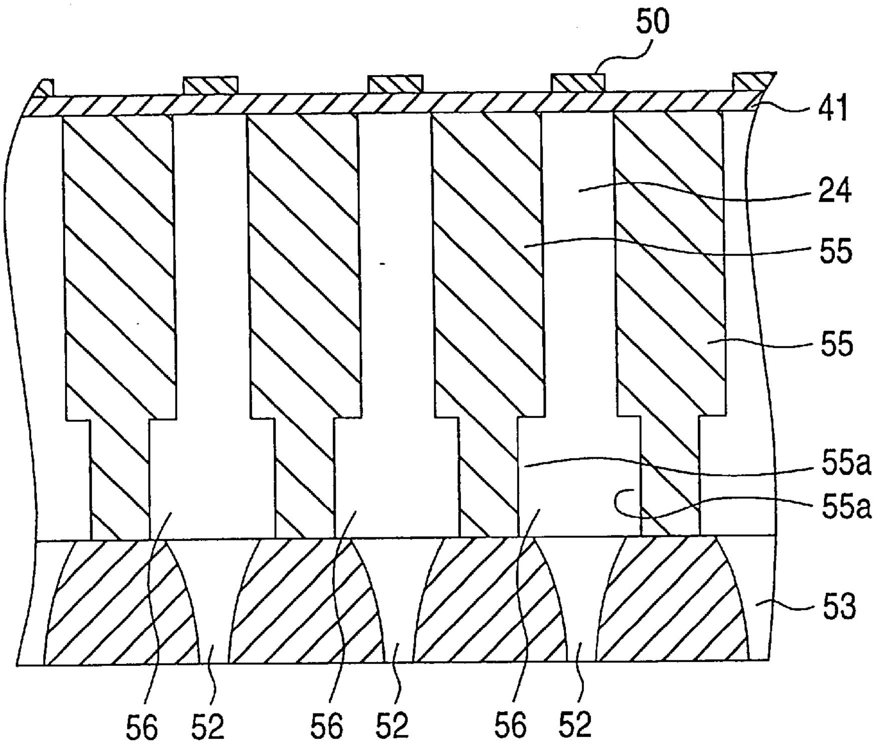
FIGS. 8*a* and 8*b* are section views showing an embodiment of a structure which connects the pressure chamber of the flow path substrate to a nozzle opening of a nozzle plate, and a diagram showing the structure of the flow path substrate as seen from the nozzle opening, respectively.
Figure 8B:
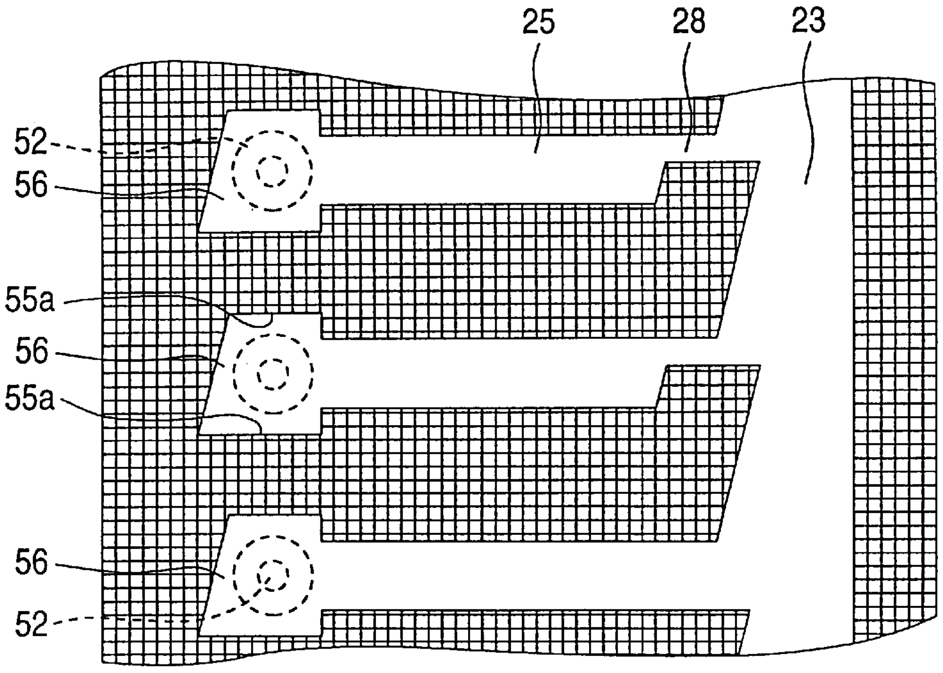
Figure 10A:
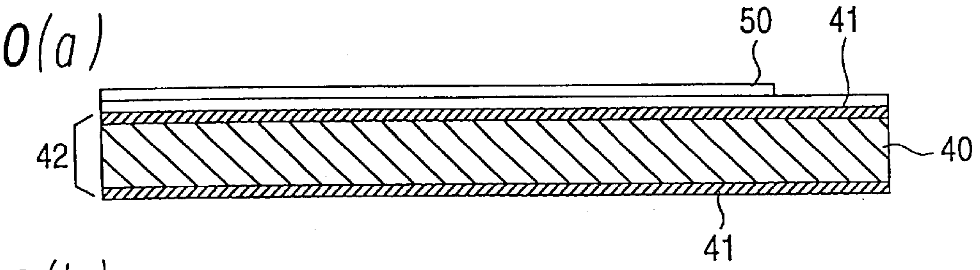
FIGS. 10(*a*)–10(*f*) are section views showing an embodiment of the recording head configured with the flow path substrate and showing steps in the method of producing the substrate.
Figure 10B:
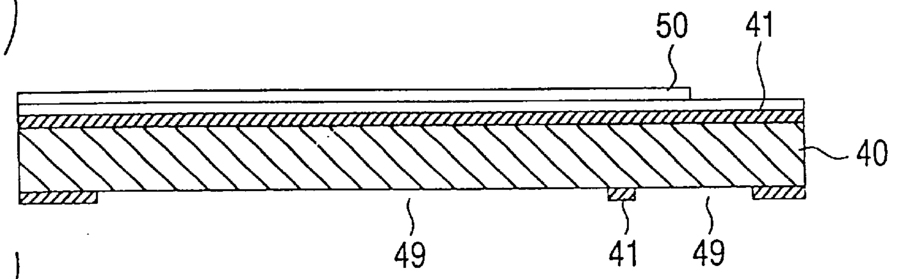
Figure 10C:
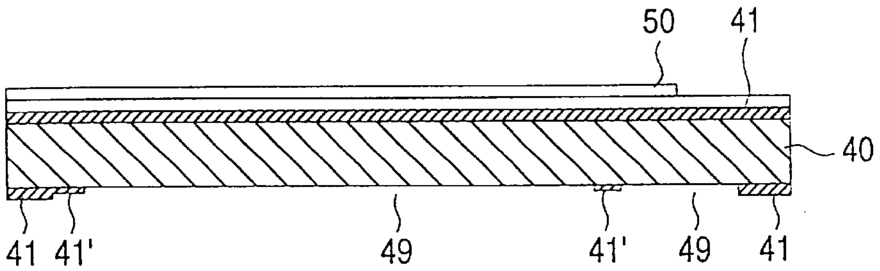
Figure 10D:
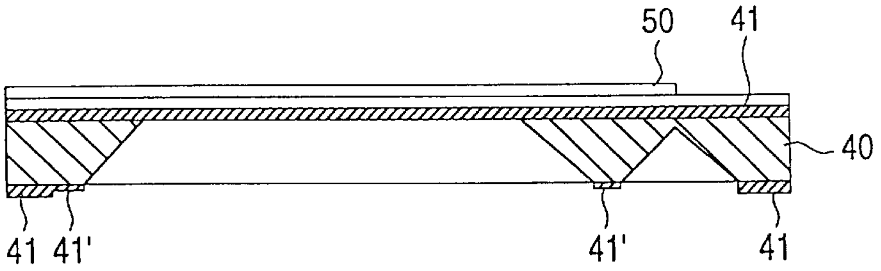
Figure 10E:
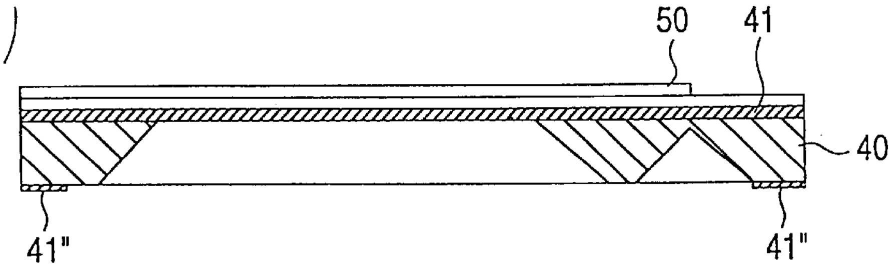
Figure 10F:
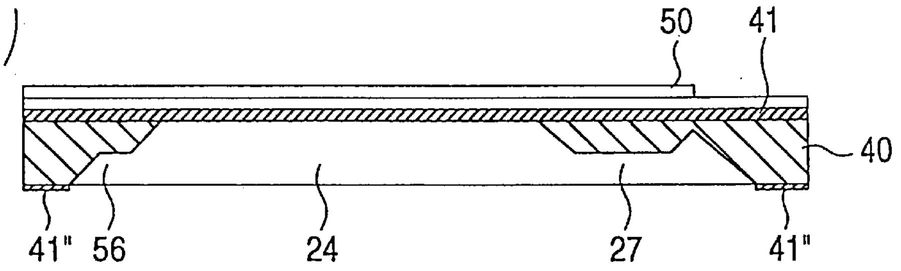

FIGS. 8*a* and 8*b* show an embodiment which can solve the problem. In the figures, 55 designates partition walls defining the pressure chambers 24. In each of the pressure chambers, a nozzle connecting portion 56 is formed by forming recesses 55*a* so that an opening of a width greater than the diameter Φ2 of the nozzle opening 52 is ensured. When ink is to be supplied only from one side of the pressure chamber 24, the nozzle opening is disposed on the other side of the pressure chamber. When a wafer of a (110) plane orientation is used as the single-crystal silicon substrate and the above-described anisotropic etching is conducted, a (111) plane inclined at about 35 deg. to a (110) plane appears at both the ends of the pressure chamber 24. As shown in FIG. 9, therefore, a portion which has an inclined face opposing the nozzle plate 53 at an angle of about 35 deg. and which is surrounded by small angles is produced in the pressure chamber 25. An air bubble entering the ink or produced during the operation of the recording head easily stagnates in such a small-angle region. An air bubble produced in this way absorbs the pressure of ink which is pressurized by the driving portion 50, thereby causing the ink ejection ability to be lowered. When the nozzle connecting portion 56 is to be formed, therefore, consideration is preferably taken so that the nozzle opening 52 is located as near as possible at a position opposing the inclined face portion 25*a*.

FIG. 10 shows an embodiment of a method of producing the above-described pressure chamber substrate. A single-crystal silicon substrate 40 which is cut at (110) is subjected to thermal oxidation, thereby preparing a base material 42 on which an $SiO_2$ layer 41 of about 1 μm is formed on the entire surface. The driving portion 50 is formed on the surface of the $SiO_2$ layer 41 in the same manner as described above with respect to FIG. 4*b* (Step I, see FIG. 10(*a*)). A photoresist layer is formed and the $SiO_2$ layer 41 is removed by using a hydrofluoric acid buffer solution in which hydrofluoric acid and ammonium fluoride are mixed in proportions of 1 : 6, so as to pattern a window 49 for anisotropic etching (Step II, see FIG. 10(*b*)). Thereafter, the above-mentioned multiple exposure is conducted only on the regions of the $SiO_2$ layer which will serve as the nozzle connecting portion 56 and in which the ink supply ports 26 are formed. Half-etching is then conducted for about 5 min. by using the above-mentioned hydrofluoric acid buffer solution so that the thickness of the $SiO_2$ layer is reduced to about 0.5 μm, thereby forming an $SiO_2$ layer 41' (Step III, see FIG. 10(*c*)). After the resist layer is removed away, the base material 42 is immersed into a 10% by weight solution of potassium hydroxide heated to about 80° C., thereby executing anisotropic etching. As a result of the etching, also the $SiO_2$ layers 41 and 41' which have functioned as protective films are gradually dissolved so that a portion of about 0.4 μm is etched away, with the result that the $SiO_2$ layer 41' in the regions where the ink supply ports 26, 27, and 28 are to be formed has a thickness of about 0.1 μm and the $SiO_2$ layer 41 in the other region has a thickness of about 0.6 μm (Step IV, see FIG. 10(*d*)). The base material 42 is immersed into the hydrofluoric acid buffer solution during a period sufficient for removing the $SiO_2$ layer of 0.1 μm, for example, about 1 min. so that the $SiO_2$ layer 41' in the regions of the $SiO_2$ layer which opposes the nozzle opening 52 and in which the ink supply port 26 is to be formed is removed away and an $SiO_2$ layer 41" of a thickness of about 0.5 μm remains in the other region (Step V, see FIG. 10(*e*)). The base material 42 is immersed into an about 40% by weight solution of potassium hydroxide so as to be subjected to anisotropic etching, whereby the region which opposes the nozzle opening 52 and in which the ink supply port 26 is to be formed are again selectively etched. This makes the regions thinner so that the nozzle connecting portion 56 and the ink supply port 26 having a necessary fluid resistance are formed (Step VI, see FIG. 10(*f*)).

Figure 11A:
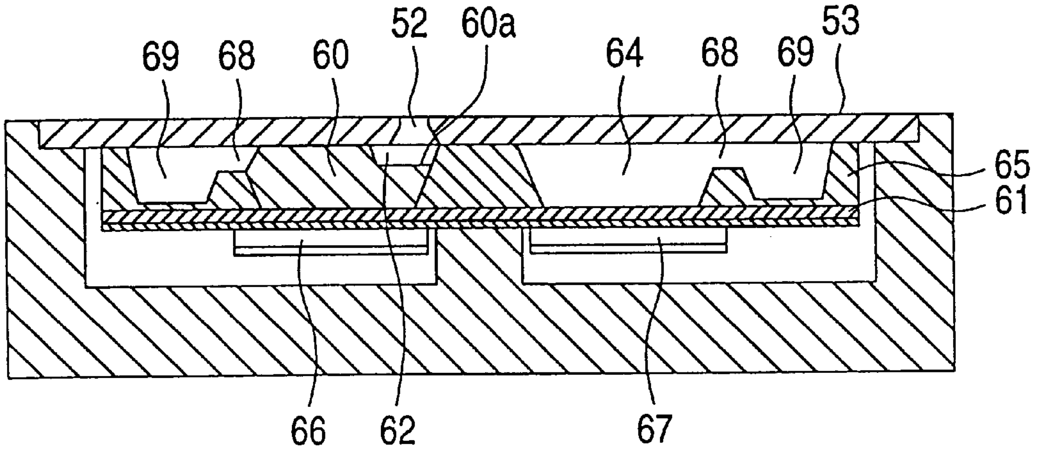
FIGS. 11*a* and 11*b* are section views respectively taken along a longitudinal direction and a width direction of a pressure chamber and showing another embodiment of the recording head of the invention.
Figure 11B:
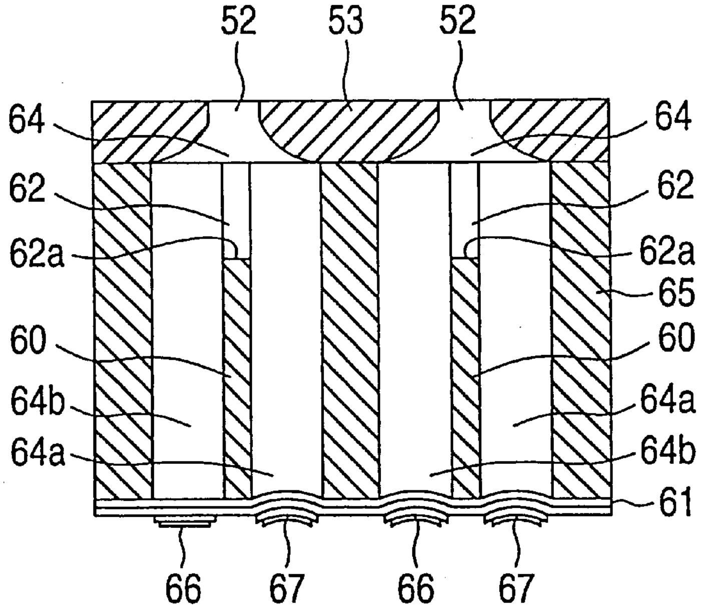
Figure 12A:
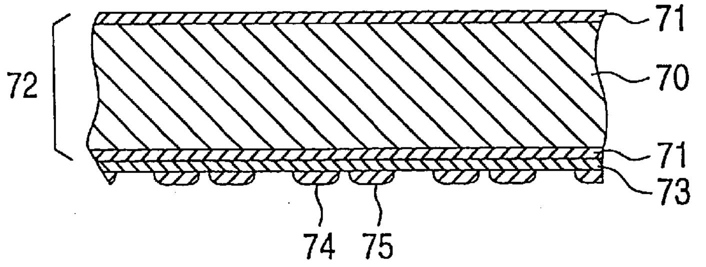
FIGS. 12(*a*)–12(*e*) are views showing sections taken in a width direction of the pressure chamber and showing a method of producing a substrate constituting the recording head.
Figure 12B:
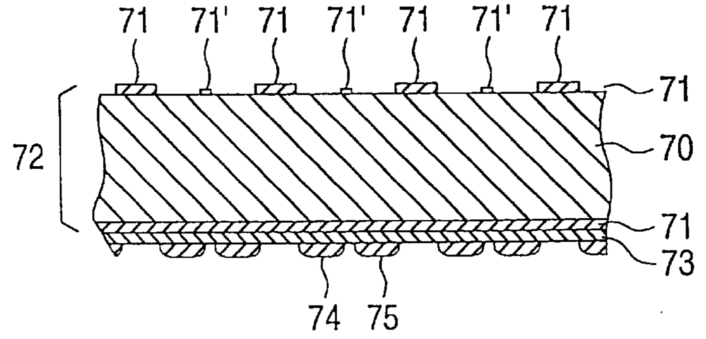
Figure 12C:
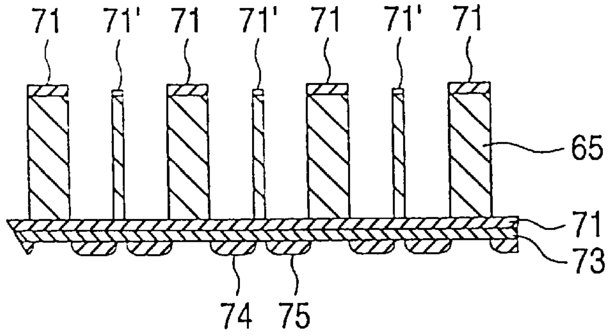
Figure 12D:
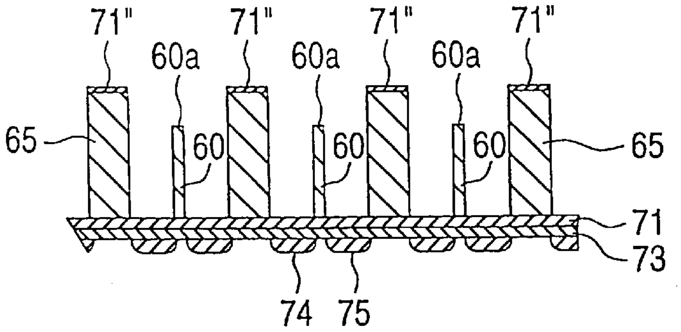
Figure 12E:
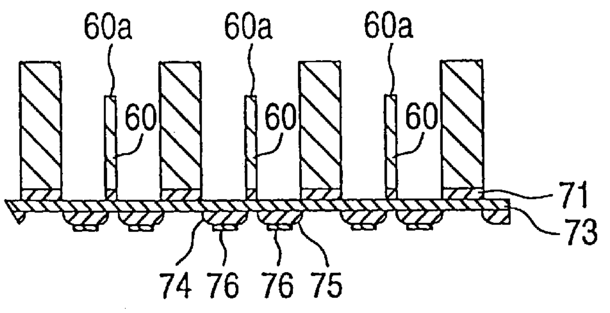

FIGS. 11*a* and 11*b* show an embodiment of another recording head which can solve the problems caused by connecting the nozzle opening to the pressure chamber and adjusting the ink amount of an ink drop. The reference numeral 60 designates a center partition wall in which one end is fixed to an elastic film 61. The other end of the wall elongates in a region not opposing the nozzle opening 52 to a position abutting the nozzle plate 53, and is configured in the vicinity of the nozzle opening 52 so as to form a through hole 62 which allows ink to pass therethrough. According to this configuration, one pressure chamber 64 which communicates with the one nozzle opening 62 is divided by the center partition wall 60 into two cells 64*a* and 64*b* in communication with each other, and the nozzle plate 53 is supported by a partition wall 65 defining the pressure chamber 64 and by a part of the center partition wall 60. The thickness of the center partition wall 60 is selected to be about 15 μm so that, when the pressure chambers 64 of a length of 2 mm are arranged at a pitch of 141 μm, the cells 64*a* and 64*b* divided by the center partition wall 60 have a width of 46 μm.

On the other hand, on the surface of the elastic film 61, two driving portions 66 and 67 are formed for each pressure chamber so as to be positioned between the center partition wall 60 and the partition wails 65 defining the pressure chamber 64. In the figures, 68 designates an ink supply port through which an ink reservoir 69 is connected to the pressure chamber 64.

In the thus configured recording head, when a driving signal is applied to the two driving portions 66 and 67 of one pressure chamber 64 so that the two cells 64*a* and 64*b* simultaneously contract, ink of the first cell 64*a* and that of the second cell 64*b* are simultaneously pressurized and an ink drop of an amount proportional to the flexural amount of the two driving portions 66 and 67 is ejected via the through hole 62 from the nozzle opening 52. When a driving signal is applied only to the driving portion 67 of the one pressure chamber 64, ink of the one cell 64*a* is ejected from the nozzle opening 52. As a result, the amount of ink constituting an ink drop can be easily adjusted by selectively applying a driving signal to only one of or both of the two driving portions 66 and 67 of one pressure chamber 64, thereby adjusting the size of a dot which is to be formed on a recording medium. Furthermore, one pressure chamber 64 can be set to have a width which is approximately equal to the diameter of the nozzle opening 52 on the side of the pressure chamber, whereby the problem of the nozzle opening 52 being closed by the partition wall 65 defining the pressure chamber 64 can be prevented from arising.

Next, a method of producing a substrate constituting the recording head will be described with reference to FIG. 12.

a base material 72 is prepared wherein an $SiO_2$ layer 71 of a thickness of about 1 μm is formed by the thermal oxidation method or the like on the entire surface of a single-crystal silicon substrate 70 which is cut so that the surface extends along a (110) crystal axis. An elastic film 73 made of zirconia (Zr) or platinum is formed by sputtering on the surface of the base material 72. In the same manner as described above, a lower electrode, and a piezoelectric film made of PZT or the like are formed so that two driving portions 74 and 75 are formed for each pressure chamber (Step I, see FIG. 12(*a*)). A photoresist layer is formed at positions opposing the partition walls 65 and the center partition wall 60 of the pressure chamber. The $SiO_2$ layer 71 is removed by using a hydrofluoric acid buffer solution in which hydrofluoric acid and ammonium fluoride are mixed in proportions of 1 : 6, so as to pattern a window for anisotropic etching. Thereafter, the above-mentioned multiple exposure is conducted only on an $SiO_2$ layer 71' of a region where the through hole of the center partition wall 60 is to be formed. Half-etching is then conducted for about 5 min. by using the above-mentioned hydrofluoric acid buffer solution so that the $SiO_2$ layer 71' of a thickness of about 0.5 μm is formed (Step II, see FIG. 12(*b*)). After the resist layer is removed away, the base material 72 is immersed into a 10% by weight solution of potassium hydroxide heated to about 80° C., thereby executing anisotropic etching. As a result of the etching, also the $SiO_2$ layers 71 and 71' which have functioned as protective films are gradually dissolved so that a portion of about 0.4 μm is etched away, with the result that the $SiO_2$ layer 71' in the regions where the through hole of the center partition wall 60 is to be formed has a thickness of about 0.1 μm and the $SiO_2$ layer 71 in the other region has a thickness of about 0.6 μm (Step III, see FIG. 12(*c*)).

The base material 72 is immersed into the hydrofluoric acid buffer solution for, for example, about 1 min. so that the $SiO_2$ layer 71' in the region where the through hole of the center partition wall 60 is to be formed is removed away and an $SiO_2$ layer 71" of a thickness of about 0.5 μm remains in the other region. The base material is again immersed into an about 40% weight solution of potassium hydroxide so as to be subjected to anisotropic etching, whereby a step 60*a* functioning as the through hole 62 is formed in the center partition wall 60 (Step IV, see FIG. 12(*d*)). The $SiO_2$ layer 71 in the region of the elastic film 73 opposing the pressure chamber is etched away by using hydrogen fluoride. Finally, a low-rigidity material such as gold or aluminum is sputtered onto the surfaces of the driving portions 74 and 75 so that an upper electrode 76 is formed (Step V, see FIG. 12(*a*)). When the elastic film 73 is made of a metal such as platinum, the elastic film may function as the lower electrode.

The driving portions which are formed on the elastic film as described above are configured by using a film forming technique in which a piezoelectric material is sputtered. Therefore, the driving portions are much thinner than those which are formed by applying a green sheet of a piezoelectric material, with the result that the driving portions have a large electrostatic capacity. This produces various problems. Furthermore, since the piezoelectric material existing in the wiring region has piezoelectric properties in the same manner as the driving portions, also the wiring region is displaced, thereby producing a further problem in that the lead pattern formed above is fatigued.

Figure 13:
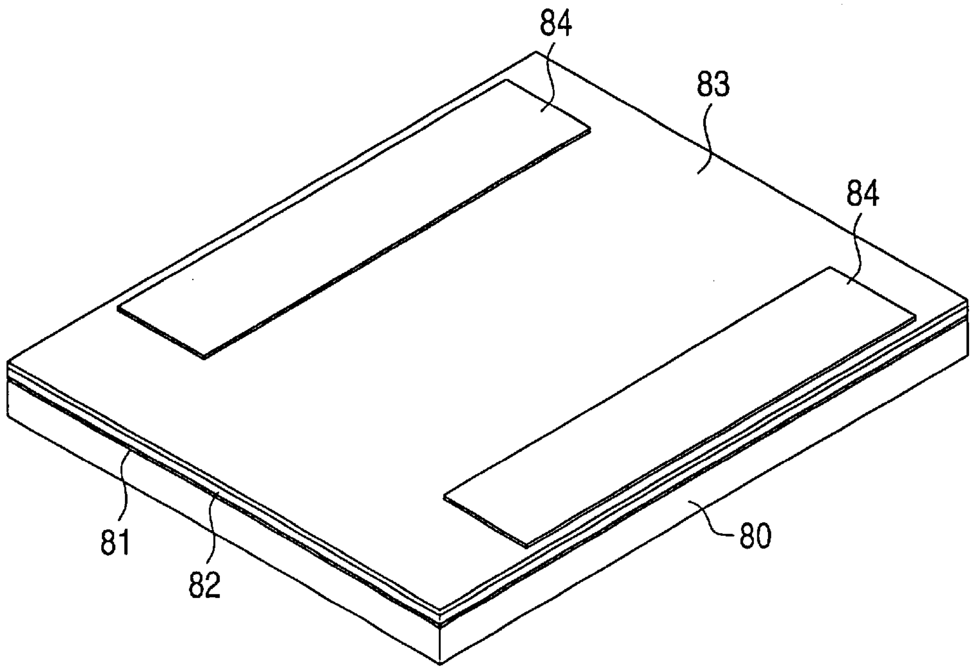
FIG. 13 is a view showing the structure of a substrate suitable for forming a piezoelectric film to be formed on the surface of an elastic film, and a wiring portion.
Figure 14:
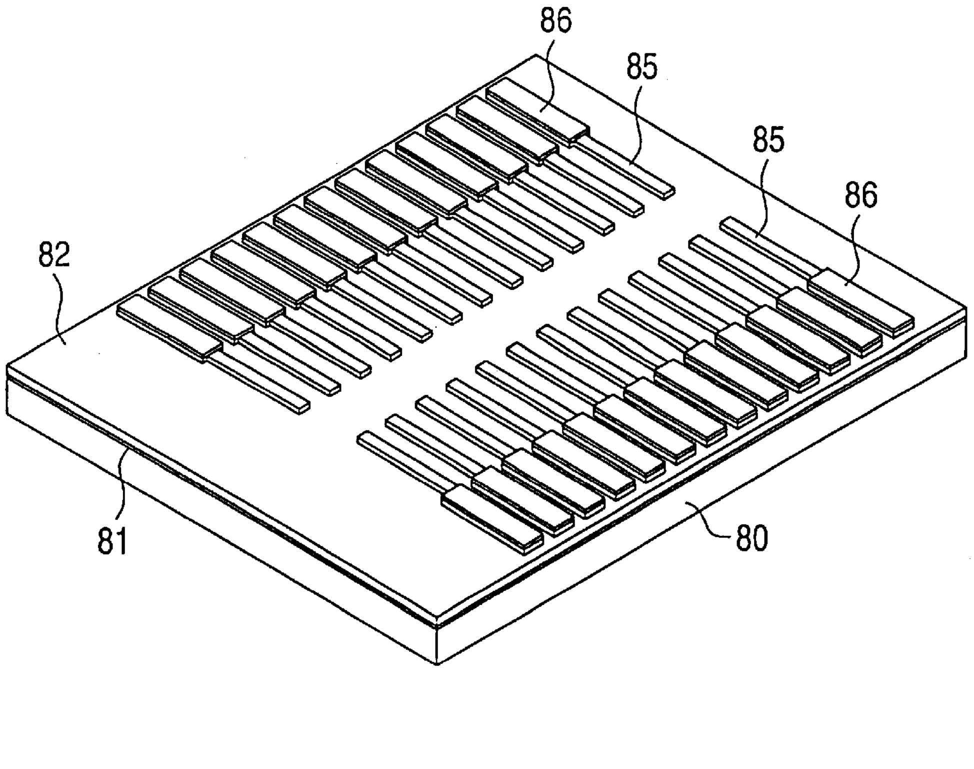
FIG. 14 is a view showing the structure of a driving portion and a wiring portion which are configured by using the substrate of FIG. 13.
Figure 15A:
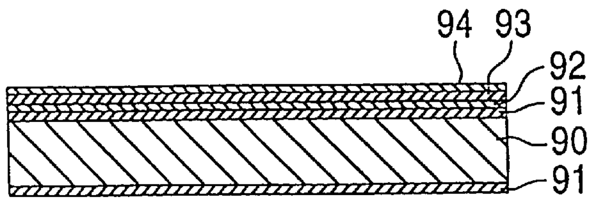
FIGS. 15(*a*)–15(*f*) are views showing steps of producing the driving portion and the wiring portion.
Figure 15B:
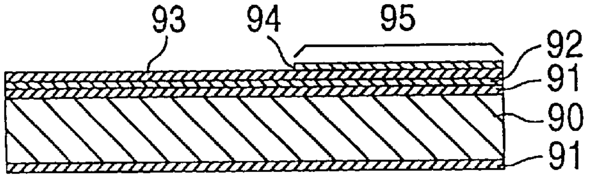
Figure 15C:
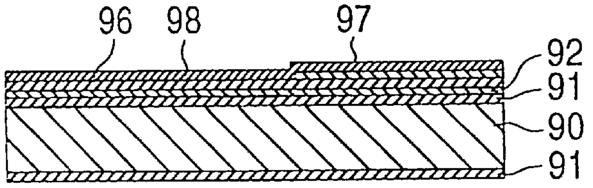
Figure 15D:
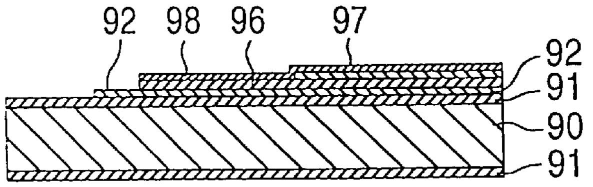
Figure 15E:
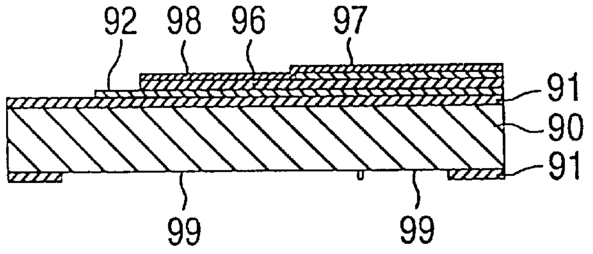
Figure 15F:
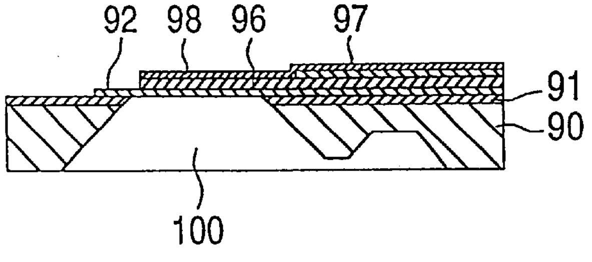

FIG. 13 shows an embodiment which can solve such problems. In the figure, 80 designates a flow path substrate which is configured by a single-crystal silicon substrate. In the same manner as described above, an $SiO_2$ film 81 and an elastic film 82 which is made of an anticorrosion noble metal or zirconia oxide are formed on the surface of the substrate. When zirconia oxide is used, a lower electrode is formed on the surface of elastic film and a piezoelectric film 83 is then formed so as to cover the entire surface. The piezoelectric film 83 is formed by subjecting a material such as a PZT material which conducts flexural vibration in response to an application of an electric field, to a film forming technique, for example, the sputtering method or the sol-gel method. The reference numeral 84 designates a low-dielectric constant region having piezoelectric properties and a dielectric constant which are lower than those of the piezoelectric film 83. The low-dielectric constant region is formed in a wiring region where a lead pattern for supplying a signal to the driving portion is disposed. After the piezoelectric film 83 and the low-dielectric constant region 84 are formed in this way, as shown in FIG. 14, etching or the like is conducted so that only the regions of the piezoelectric film 83 opposing the pressure chambers remain and the low-dielectric constant region 84 has a shape suitable for the formation of the lead pattern, thereby configuring driving portions 85 and lead pattern forming portions 86.

Next, a production method will be described with reference to FIG. 15.

A film of platinum which will function as a lower electrode 92 is formed so as to have a thickness of 800 nm on the surface of an etching protective film 91 of a single-crystal silicon substrate 90 by a thin-film formation method such as the sputtering film formation method. In this film formation, in order to enhance the adhesion strength exerted between the platinum layer and the upper and lower layers, a very-thin intermediate layer of titanium or chromium may be formed. In the embodiment, the lower electrode 92 serves also as an elastic film. a film of a first piezoelectric film precursor 93 is formed on the lower electrode. In the embodiment, the film formation was conducted by the sol-gel method by using a PZT piezoelectric film precursor material in which lead titanate and lead zirconate are mixed at a mole compounding ratio of 55% and 45%, and repeating steps of applying, drying, and degreasing six times so as to obtain a thickness of 1 μm.

It was confirmed that, when the composition is selected so that a resulting piezoelectric film has the composition of $$Pb_C Ti_A Zr_B O_3$$

(where A, B, and C are numerals, A+B=1, $0.5 \leqq A \leqq 0.6$, and $0.85 \leqq C \leqq 1.10$), the precursor can exhibit piezoelectric properties suitable for ejection of ink drops. It is a matter of course that the film may be formed in a similar manner by using another film forming technique such as the high-frequency sputtering film formation, or the CVD. In order to form a low-dielectric constant layer on the surface of the precursor 93, in the embodiment, a lead oxide film 94 of a thickness of 500 nm is formed by the sol-gel method (Step I, see FIG. 15(*a*)).

Next, the lead oxide film 94 other than the region which will function as a wiring region 95 is etched away. Thereafter, the whole of the substrate is heated in an oxygen ambient at 650° C. for 3 min. and then at 900° C. for 1 min. The substrate is naturally cooled so that the first piezoelectric film precursor 93 is crystallized to be completed as a piezoelectric film 96.

On the other hand, in the wiring region where the lead oxide film 94 is formed, the lead of the lead oxide film 94 is caused by the above-mentioned heating to be diffused and dissolved into the first piezoelectric film precursor 93, with the result that a different composition film 97 having a low dielectric constant is baked. Analyzation of the different composition film 97 showed that lead was increased to an amount which is 1.12 times the total number of moles of zirconia and titanium (Step II, see FIG. 15(*b*)). A film of platinum of a thickness of 200 nm is formed by sputtering on the surfaces of the piezoelectric film 96 and the different composition film 97, thereby forming an upper electrode 98 (Step III, see FIG. 15(*c*)). The upper electrode 97 and the piezoelectric film 95 are divided into a predetermined shape by ion milling using an etching mask so as to correspond to the positions where the pressure chambers are to be formed (Step IV, see FIG. 15(*d*)). The etching protective film 91 on the opposite face of the single-crystal silicon substrate 90 is removed away by hydrogen fluoride so as to coincide of the shapes of the pressure chamber, a reservoir, and an ink supply port, thereby forming a window 99 (Step V, see FIG. 15(*e*)). The single-crystal silicon substrate 90 is subjected to anisotropic etching using an anisotropic etchant, for example, an approximately 17% by weight aqueous solution of potassium hydroxide heated to 80° C., so that the etched portion reaches the protective film 91 on the surface. Thereafter, the protective film 91 on the back face of the piezoelectric film 95 is removed by hydrogen fluoride and a flow path of a pressure chamber 100, etc. is formed (Step VI, see FIG. 15(*f*)).

The thus formed driving portion has an electrostatic capacity of 7 nF per element. As compared with an electrostatic capacity of about 10 nF obtained in the prior art, the electrostatic capacity is reduced by about 30%. Reliability evaluation tests by means of long term printing were performed. In prior art recording heads, at 50,000,000 ink drop ejections, a lead pattern was broken or a film separation occurred so that a signal supply was disabled. By contrast, in recording heads according to the invention, the defective rate was reduced or about 1% or less even at 2,000,000,000 ink ejections. This was caused by the fact that the amount of lead in the different composition film 96 in the wiring region is larger than that in the piezoelectric film 95 so that the composition is deviated from the optimum composition of a piezoelectric film. The dielectric constants and piezoelectric properties of the piezoelectric film 95 and the different composition film 96 were measured. The measurement results show that the piezoelectric film 95 and the different composition film 96 have dielectric constants of 1,800 and 900, respectively, and piezoelectric properties of 150 PC/N and 80 PC/N, respectively. It was confirmed that, according to the invention, both the electrostatic capacity of one element and the piezoelectric displacement of the wiring region are reduced and the mechanical fatigue and the fatigue due to a heat cycle in a lead pattern are decreased.

The inventor conducted further experiments to investigate piezoelectric properties. In the experiments, the lead oxide film 94 to be formed on the surface of the PZT precursor 93 was baked with various thicknesses for the lead oxide film so that the content of lead oxide with respect to the stoichiometrical composition of the different composition film 96 was varied. It was found that, when a composition is attained in which the amount of lead oxide with respect to the stoichiometrical composition is 0.85 or smaller or 1.10 or larger, piezoelectric properties are largely lowered. Piezoelectric properties were similarly evaluated by using titanium oxide or zirconium oxide in place of lead oxide. It was found also that, when the ratio of Ti or Zr to the total amount of Ti or Zr constituting the piezoelectric film 95 is 0.5 or smaller or 0.6 or larger, piezoelectric properties are largely lowered. From the above, it was found that the dielectric constant and piezoelectric properties can be lowered only by shifting the content of a component element without changing the composition of the piezoelectric film precursor 93 of the wiring region from that at which the precursor is expected to operate as a piezoelectric film in an optimum manner.

In the above, the embodiment in which the elastic film is made of a PZT material has been described. It is obvious that, even when a material to which another metal oxide such as nickel niobate, nickel oxide, or magnesium oxide is added, or a material other than a PZT material is used, the same effects can be attained by adding a material which ensures the adhesion to a substrate and lowers piezoelectric properties and the dielectric constant.

Figure 16:
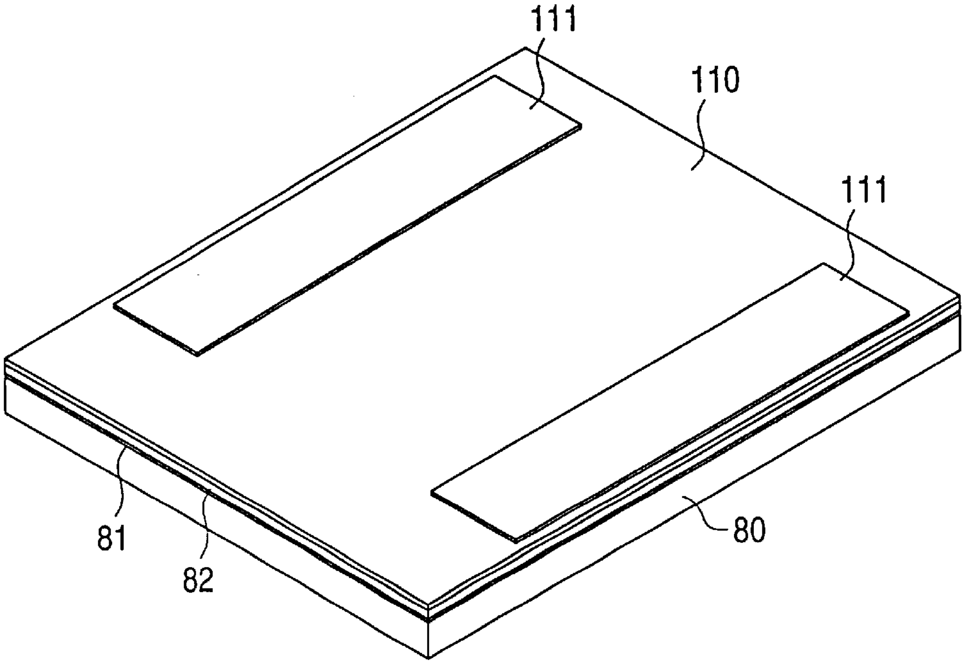
FIG. 16 is a view showing another embodiment of a substrate suitable for forming a piezoelectric film to be formed on the surface of an elastic film, and a wiring portion.
Figure 17:
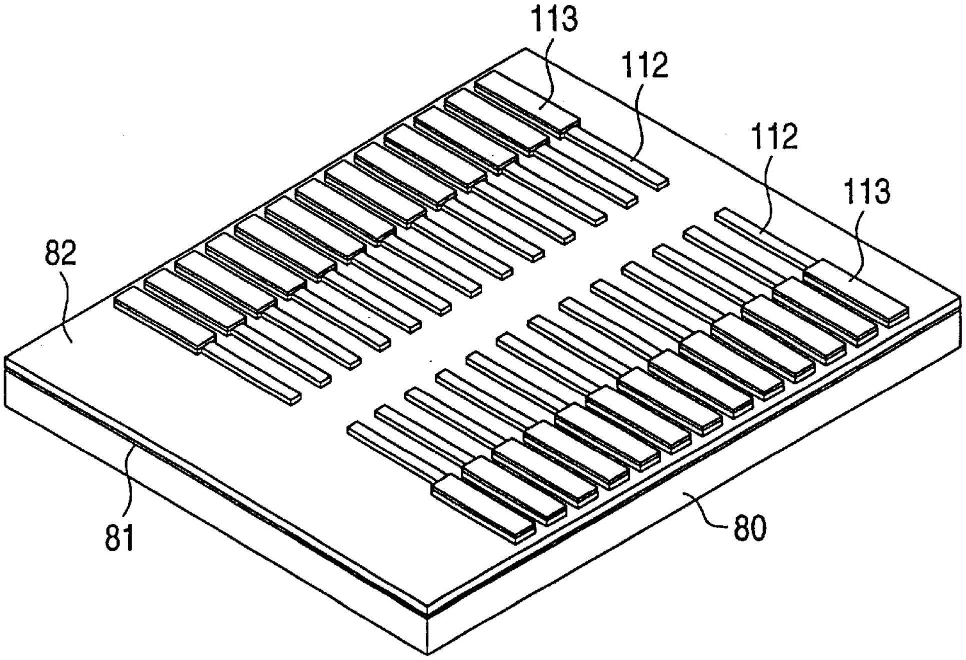
FIG. 17 is a view showing the structure of a driving portion and a wiring portion which are configured by using the substrate of FIG. 16.
Figure 18A:
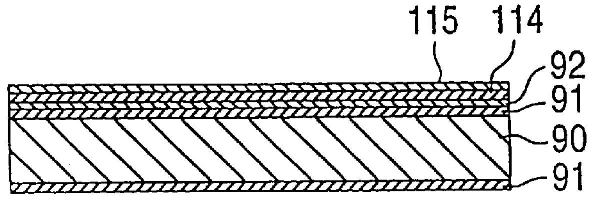
FIGS. 18(*a*)–18(*f*) are views showing steps of producing the driving portion and the wiring portion.
Figure 18B:
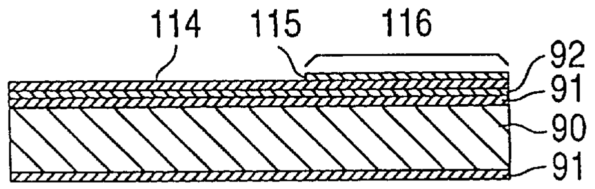
Figure 18C:
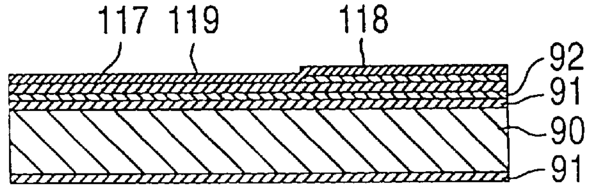
Figure 18D:
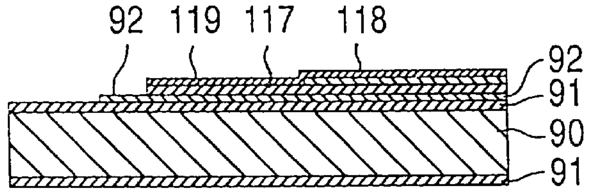
Figure 18E:
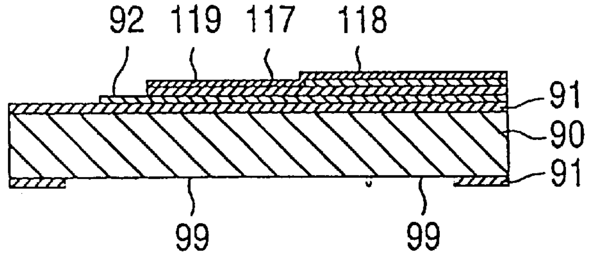
Figure 18F:
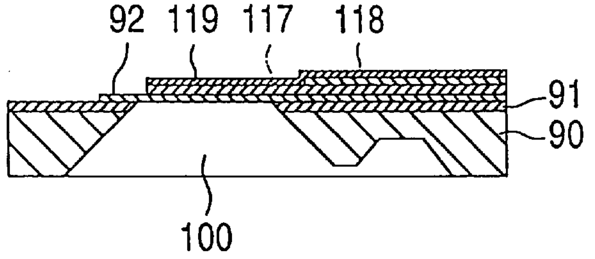

FIGS. 16 and 17 show a further embodiment in which the displacement and the electrostatic capacity of a piezoelectric film in a wiring region can be reduced. In the embodiment, a low-dielectric constant layer 111 is formed in a wiring region in the surface of a piezoelectric film 110 which is formed of the entire surface of an elastic plate 82. After the piezoelectric film 110 and the dielectric layer 111 are formed as described above, as shown in FIG. 17, etching or the like is conducted so that only the regions of the piezoelectric film 110 opposing the pressure chambers remain and the low-dielectric constant layer 111 has a shape suitable for the formation of the lead pattern, thereby configuring driving portions 112 and lead pattern forming portions 113.

Next, a production method will be described with reference to FIG. 18. A film of platinum which will function as a lower driving electrode 92 is formed so as to have a thickness of 800 nm on the surface of the etching protective film 91 of the single-crystal silicon substrate 90 on the side of a piezoelectric layer, by a thin-film formation method such as a sputtering film formation method. A film of a first piezoelectric film precursor 114 is formed on the lower driving electrode 92. In the embodiment, the film formation was conducted by the sol-gel method by using a PZT-PMN piezoelectric film precursor material in which lead titanate, lead zirconate, and magnesium-lead niobate are mixed at a mole compounding ratio of 55%, 40%, and 10%, and repeating steps of applying, drying, and degreasing six times so as to obtain a thickness of 1 μm.

It was confirmed that, when the composition is selected so that the precursor 114 obtained after baking has the composition of $$PbTI_AZr_B(Mg_{1/3}Nb_{2/3})_CO_{3+e}PbO$$

(where A, B, C, and e are numerals, A+B+C=1, $0.35\leqq A\leqq 0.55$, $0.25\leqq B\leqq 0.55$, $0.1\leqq C\leqq 0.4$, and $0\leqq e\leqq 0.3$), the precursor 114 can exhibit piezoelectric properties suitable for ejection of ink drops. A titanium layer 115 which has a thickness of 50 nm and will function as the low-dielectric constant layer 111 is formed by sputtering on the surface of the precursor 114 (Step I, see FIG. 18(*a*).

Next, the titanium layer 115 other than the region which will function as a wiring region 116 is etched away. Thereafter, the whole of the substrate is heated in an oxygen ambient at 650° C. for 3 min. and then at 900° C. for 1 min. The substrate is naturally cooled so that the precursor 114 is crystallized to be completed as a piezoelectric film. On the other hand, the titanium layer 115 becomes as titanium oxide of a thickness of about 100 nm so as to form the low-dielectric constant layer (Step II, see FIG. 18(*b*)). A film of platinum of a thickness of 200 nm is formed by sputtering on the surfaces of the piezoelectric film 117 and the titanium oxide film 118, thereby forming an upper electrode 119 (Step III, see FIG. 18(*c*)). The upper electrode 119 and the piezoelectric film 117 are divided into a predetermined shape by ion milling so as to correspond to the positions where the pressure chambers are to be formed (Step IV, see FIG. 18(*d*)). As described above, the etching protective film 91 on the opposite face of the substrate 90 is etched away by hydrogen fluoride so as to coincide of the shapes of the pressure chamber, a reservoir, and an ink supply port, thereby forming the window 99 (Step V, see FIG. 18(*e*)). The single-crystal silicon substrate 90 is subjected to anisotropic etching with using an anisotropic etchant, for example, an about 17% by weight aqueous solution of potassium hydroxide heated to 80° C., so that the etched portion reaches the protective film 91 on the surface. Thereafter, the etching protective film 91 of the piezoelectric film is etched away by hydrogen fluoride (Step VI, see FIG. 18(*f*)).

The thus formed driving portion has an electrostatic capacity of 5 nF per element. As compared with an electrostatic capacity of about 10 nF obtained in the prior art, the electrostatic capacity is reduced to about one half. Reliability evaluation tests by means of long term printing were performed. In prior art recording heads, at 50,000,000 ink drop ejections, an ink ejection failure occurred in 10% of the recording heads. By contrast, in recording heads according to the invention, the defective rate was about 1% or less even at 2,000,000,000 ink ejections.

In the above, the embodiment in which the low-dielectric constant layer 118 is made of titanium oxide has been described. Alternatively, the layer may be made of a material which is suitable for forming a low-dielectric constant film, such as silicon, silicon oxide, aluminum oxide, zirconium oxide or lead oxide. It is preferable to use a material which contains an element which configures the piezoelectric film 117, in order to enhance the adhesion strength exerted between films and prevent an unexpected reaction from occurring. In the embodiment, the low-dielectric constant layer and the piezoelectric film are simultaneously baked. Alternatively, they may be separately baked, or formed without conducting the baking process or by depositing a low-dielectric constant material on the surface of a piezoelectric film.

In the embodiment, the low-dielectric constant layer 111 is made of a material which is lower in dielectric constant than the piezoelectric film. Alternatively, the layer may be made of the same material as the piezoelectric film, the upper electrode 119 may be formed by sputtering platinum in the same manner as described above, and the upper electrode and the lead portion may be then patterned. Also in the alternative, the lead portion can be thicker than the region which functions as the piezoelectric member, and hence it is apparent that the electrostatic capacity of the wiring region can be reduced.

When the wiring region is formed by the same piezoelectric material as described above, it is preferable in the view point of production to employ a configuration in which a piezoelectric material layer of a uniform thickness suitable for a wiring region and the region other than the wiring region is caused by etching or the like to function as the piezoelectric film.

Figure 19:
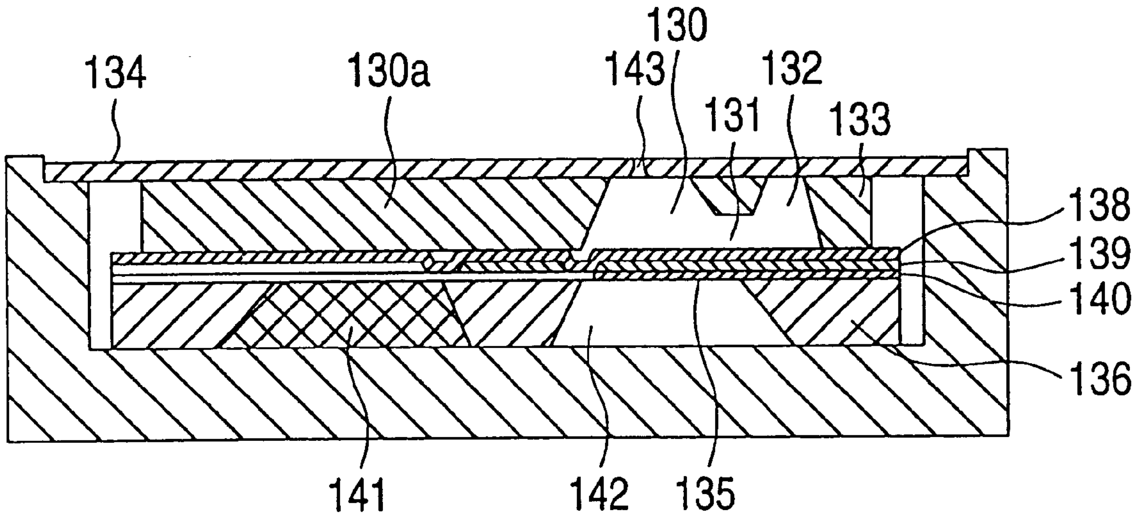
FIG. 19 is a section view showing an embodiment of a recording head in which the elastic film is configured independently of the flow path substrate.

In the above, the embodiment in which the driving portion is directly formed on an elastic plate which is integrated with the flow path substrate has been described. Alternatively, the elastic film and the driving portion may be configured as separate members and they may be then integrally fixed to each other by an adhesive agent. These alternatives attain the same effects. Specifically, as shown in FIG. 19, a pressure chamber 130 is formed in the form of a through hole on a flow path substrate 133 in which the pressure chamber 130, an ink supply port 131, and a reservoir 132 are formed. A nozzle plate 134 is liquid-tightly fixed to one face of the substrate. A pressure film substrate 136 on which a driving portion 135 is formed and which is configured as a separate member is liquid-tightly fixed to the other face of the substrate. In the pressure film substrate 136, an elastic film 138 functioning also as a lower electrode, a piezoelectric film 139, and an upper electrode 140 are formed on the surface of a single-crystal silicon substrate by the same technique described above, and then patterned so as to be formed as the driving portion 135. Thereafter, anisotropic etching is conducted on the opposite face (in the figure, the lower face) of the single-crystal silicon substrate and a recess 142 is formed so that a wall 141 is positioned between the driving portions 135. According to the embodiment, the elastic film 138 can be supported at various points by the wall 141, and hence crosstalk can be prevented from occurring even when a partition wall 130*a* defining the pressure chamber 130 of the flow path substrate 133 is made thin so that the arrangement pitch of the pressure chambers 130 is small. Since the elastic film 138 having the driving portions 135 can be formed as a separate member, the pressure chamber can be configured by conducting etching on the face of the flow path substrate 133 opposite to the side where a nozzle opening 143 is opened, i.e., the face opposite to that used in the case where an elastic film is integrated with a flow path substrate. Therefore, the pressure chamber 131 can be formed into a shape in which the dimension is gradually reduced in a direction moving from the driving portion 135 toward the nozzle opening 142, so that ink pressurized in the pressure chamber 130 is allowed to smoothly flow to the nozzle opening 143.

What is claimed is:

1. A method of producing an ink jet recording head comprising the steps of:

forming an etching protective film on a first and second face of a single-crystal silicon substrate in which a lattice plane of a surface is (110);

forming a first electrode film on said first face of said single-crystal silicon substrate;

forming a piezoelectric film on a surface of said first electrode film;

forming a second electrode film on a surface of said piezoelectric film;

dividing at least said second electrode film and piezoelectric film in correspondence with a shape of a pressure chamber;

a first patterning step of removing a part of said etching protective film from said second face of said single-crystal silicon substrate, thereby forming a window;

a second patterning step of thinning said etching protective film in a region opposing an ink supply port;

a first etching step of conducting anisotropic etching on said single-crystal silicon substrate in accordance with said window formed in said first patterning step;

a second etching step of removing said etching protective film which is thinned in said second patterning step; and conducting anisotropic etching.

2. A method as claimed in claim 1, wherein said anisotropic etching step forms first side walls of said pressure chamber in a plane perpendicular to said lattice plane of said single-crystal silicon substrate and forms second side walls in a (-11-1) plane.

3. A method of producing an ink jet recording head comprising:

a step of forming an etching protective film on a single-crystal silicon substrate in which a lattice plane of a surface is (110);

a first patterning step of removing a part of said etching protective film on one face of said single-crystal silicon substrate, thereby forming a window;

a second patterning step of thinning said etching protective film in a region opposing a nozzle connecting portion and an ink supply port;

a first etching step of conducting anisotropic etching on said single-crystal silicon substrate in accordance with said window formed in said first patterning step;

a second etching step of removing said etching protective film which is thinned in said second patterning step; and conducting anisotropic etching.

4. A method as claimed in claim 3 wherein said anisotropic ectching step forms a step in the center of a partition wall.

5. A method of producing an ink jet recording head comprising the steps of:

forming a piezoelectric film by a piezoelectric film precursor;

forming a film containing a material for a different composition film in a wiring region of said piezoelectric film precursor;

baking said film; and patterning said film into a shape corresponding to a pressure chamber and a lead pattern.

6. A method of producing an ink jet recording head comprising the steps of:

forming a piezoelectric film by a piezoelectric film precursor;

forming a low-dielectric constant film in a wiring region of said piezoelectric film precursor;

baking one of said piezoelectric film and said low-dielectric constant film; and patterning said piezoelectric film into a shape corresponding to a pressure chamber and a lead pattern.

7. A method of producing an ink jet recording head comprising the steps of:

forming a piezoelectric film at a thickness suitable for a wiring region;

thinning said piezoelectric film to a thickness suitable for piezoelectric vibration; and patterning said piezoelectric film to a shape corresponding to a pressure chamber and a lead pattern.

* * * * *